United States Patent
Zhang et al.

(10) Patent No.: US 9,785,493 B1
(45) Date of Patent: Oct. 10, 2017

(54) DATA RECOVERY METHOD AFTER WORD LINE-TO-WORD LINE SHORT CIRCUIT

(71) Applicant: SanDisk Technologies LLC, Plano, TX (US)

(72) Inventors: Zhengyi Zhang, Mountain View, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/373,887

(22) Filed: Dec. 9, 2016

(51) Int. Cl.
- *G11C 16/16* (2006.01)
- *G06F 11/07* (2006.01)
- *G11C 16/14* (2006.01)
- *G11C 16/10* (2006.01)
- *G11C 16/26* (2006.01)
- *G11C 16/34* (2006.01)
- *G06F 3/06* (2006.01)

(52) U.S. Cl.
CPC .......... *G06F 11/0727* (2013.01); *G06F 3/064* (2013.01); *G06F 3/0619* (2013.01); *G06F 3/0647* (2013.01); *G06F 3/0652* (2013.01); *G06F 3/0679* (2013.01); *G06F 11/079* (2013.01); *G06F 11/0751* (2013.01); *G06F 11/0793* (2013.01); *G11C 16/10* (2013.01); *G11C 16/14* (2013.01); *G11C 16/26* (2013.01); *G11C 16/3427* (2013.01); *G11C 16/3431* (2013.01); *G11C 16/3445* (2013.01); *G11C 16/3459* (2013.01)

(58) Field of Classification Search
CPC .................................................. G11C 16/3427

USPC .................................................... 365/185.02
See application file for complete search history.

(56) References Cited

U.S. PATENT DOCUMENTS

| 5,606,527 | A    | 2/1997  | Kwack et al. |
|-----------|------|---------|--------------|
| 6,307,778 | B1   | 10/2001 | Micheloni et al. |
| 6,545,910 | B2   | 4/2003  | Byeon et al. |
| 7,050,344 | B1 * | 5/2006  | Cho ................... G11C 16/0425 365/185.09 |
| 7,995,386 | B2 * | 8/2011  | Mizuguchi ............. G11C 16/08 365/185.02 |
| 8,437,193 | B1   | 5/2013  | Yang |
| 8,730,722 | B2 * | 5/2014  | Koh .................... G11C 11/5628 365/185.03 |
| 9,209,031 | B2   | 12/2015 | Baenninger et al. |
| 9,224,495 | B2   | 12/2015 | Jung et al. |
| 9,355,735 | B1 * | 5/2016  | Chen ........................ G11C 8/14 |

(Continued)

*Primary Examiner* — Son Mai
(74) *Attorney, Agent, or Firm* — Vierra Magen Marcus LLP

(57) ABSTRACT

A memory device and associated techniques provide a read recovery of data in case of a short circuit between word lines. When cells of a recovery word line WLrec are successfully programmed but cells of an adjacent work line WLrec+1 are not successfully programmed, the data of the cells of WLrec can be recovered. The cells of WLrec+1 are erased so that a low pass voltage on WLrec+1 is adequate to provide these cells in a conductive state during the recovery read of WLrec. Capacitive coupling between the word lines which shifts the apparent threshold voltage of the cells on WLrec is reduced so that a more accurate recovery read can be performed. Read voltages on WLrec can be upshifted compared to baseline read voltages.

20 Claims, 20 Drawing Sheets

(56) References Cited

U.S. PATENT DOCUMENTS 9,552,251 B2* 1/2017 Yuan ................... G06F 11/1004
2016/0260495 A1* 9/2016 Paudel ............... G11C 16/3427

* cited by examiner

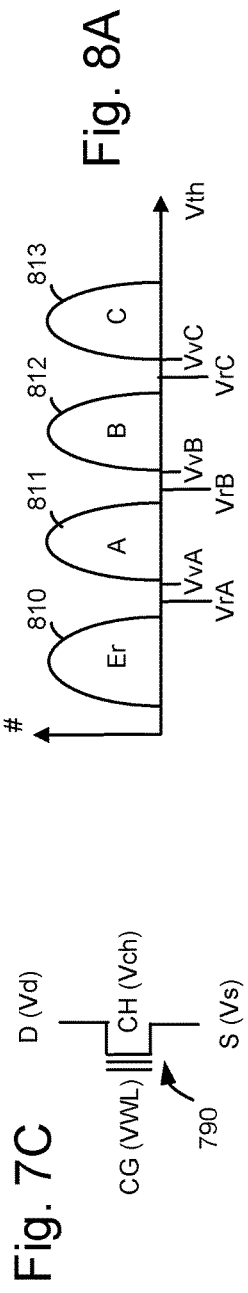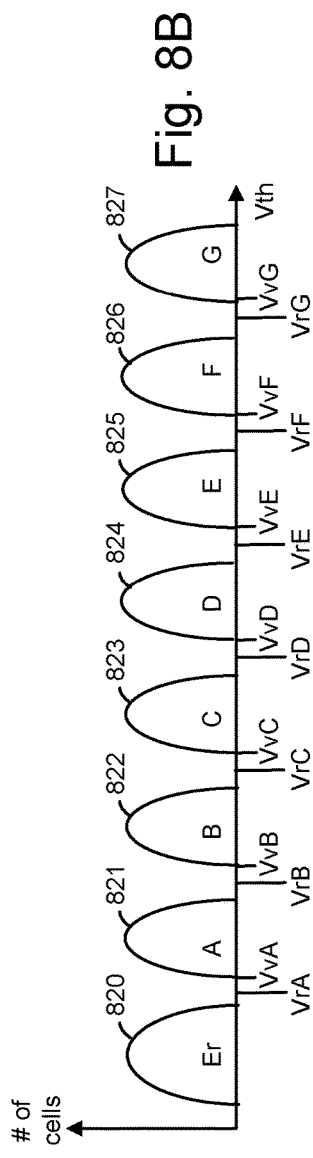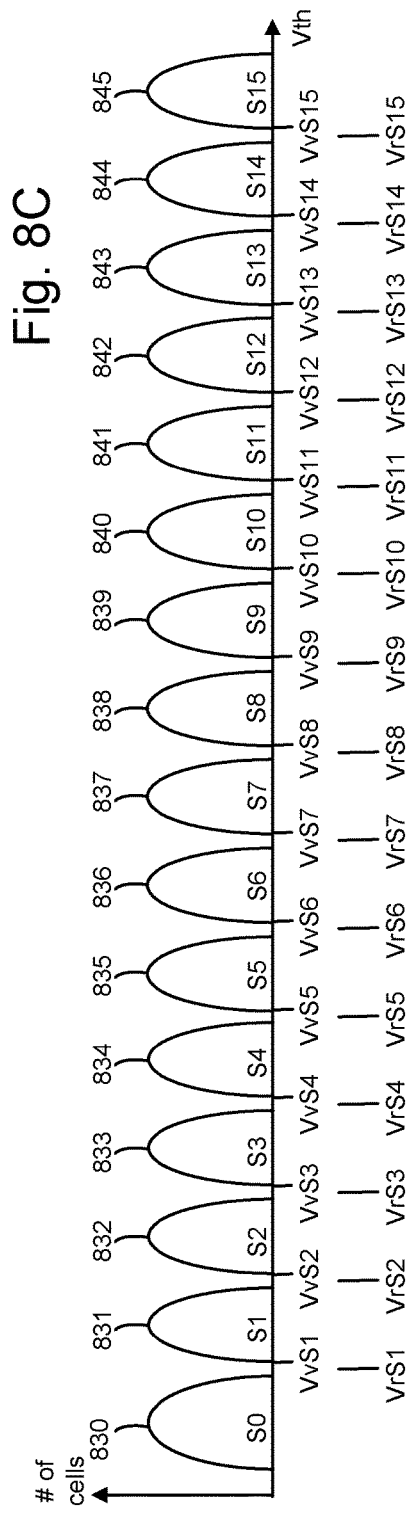

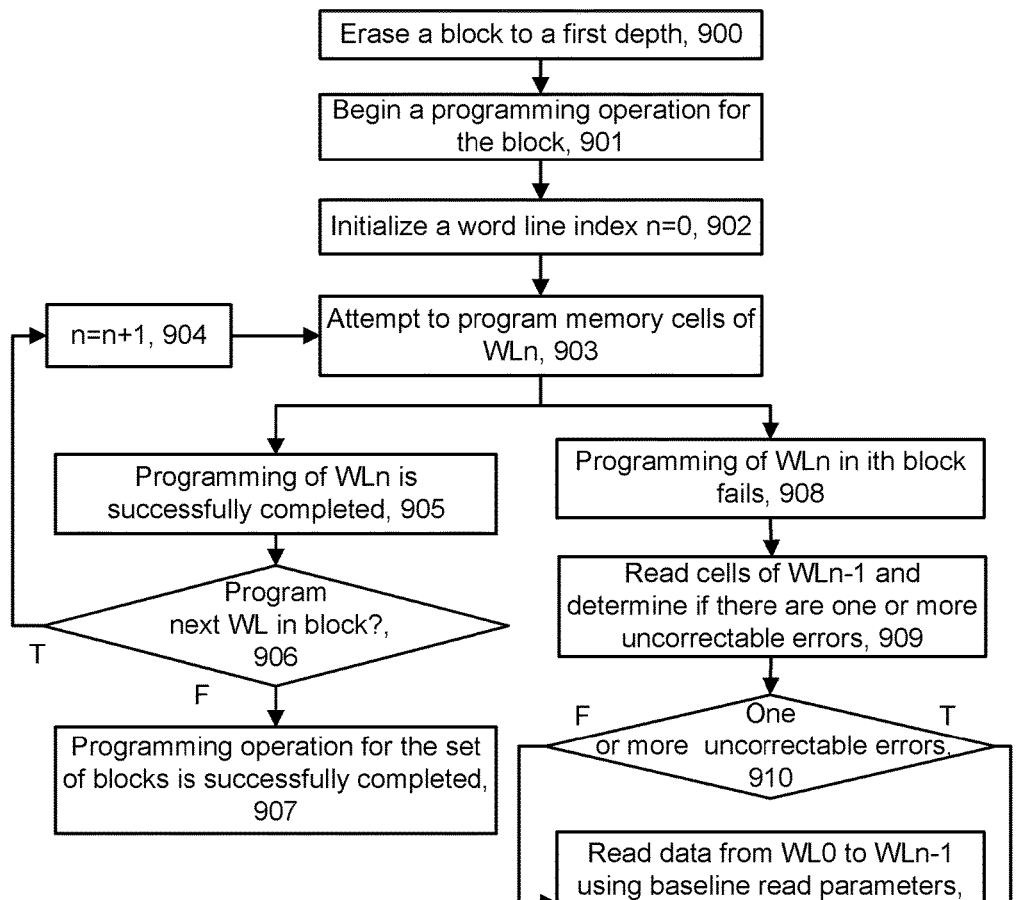
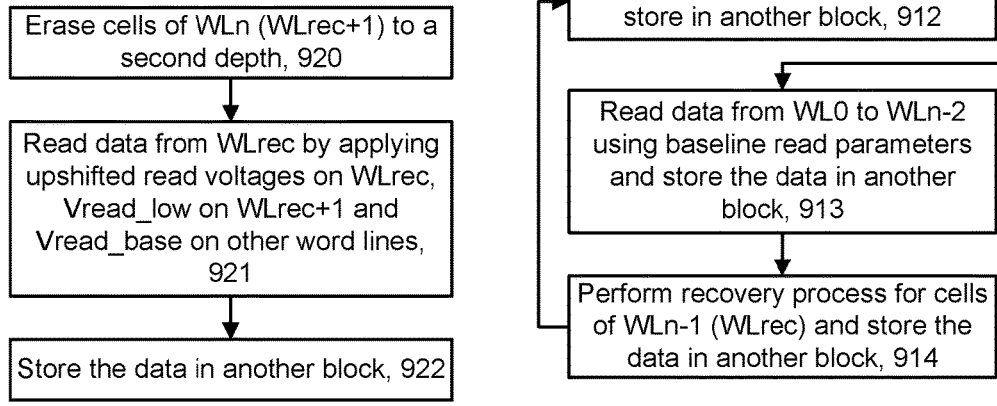

Baseline read for WLsel
WLsel:          WLunsel:
VrA, VrB, VrC   Vread_base

Recovery read for WLrec
WLrec:          WLrec+1:     other WL:
VrA_up, VrB, VrC  Vread_low   Vread_base

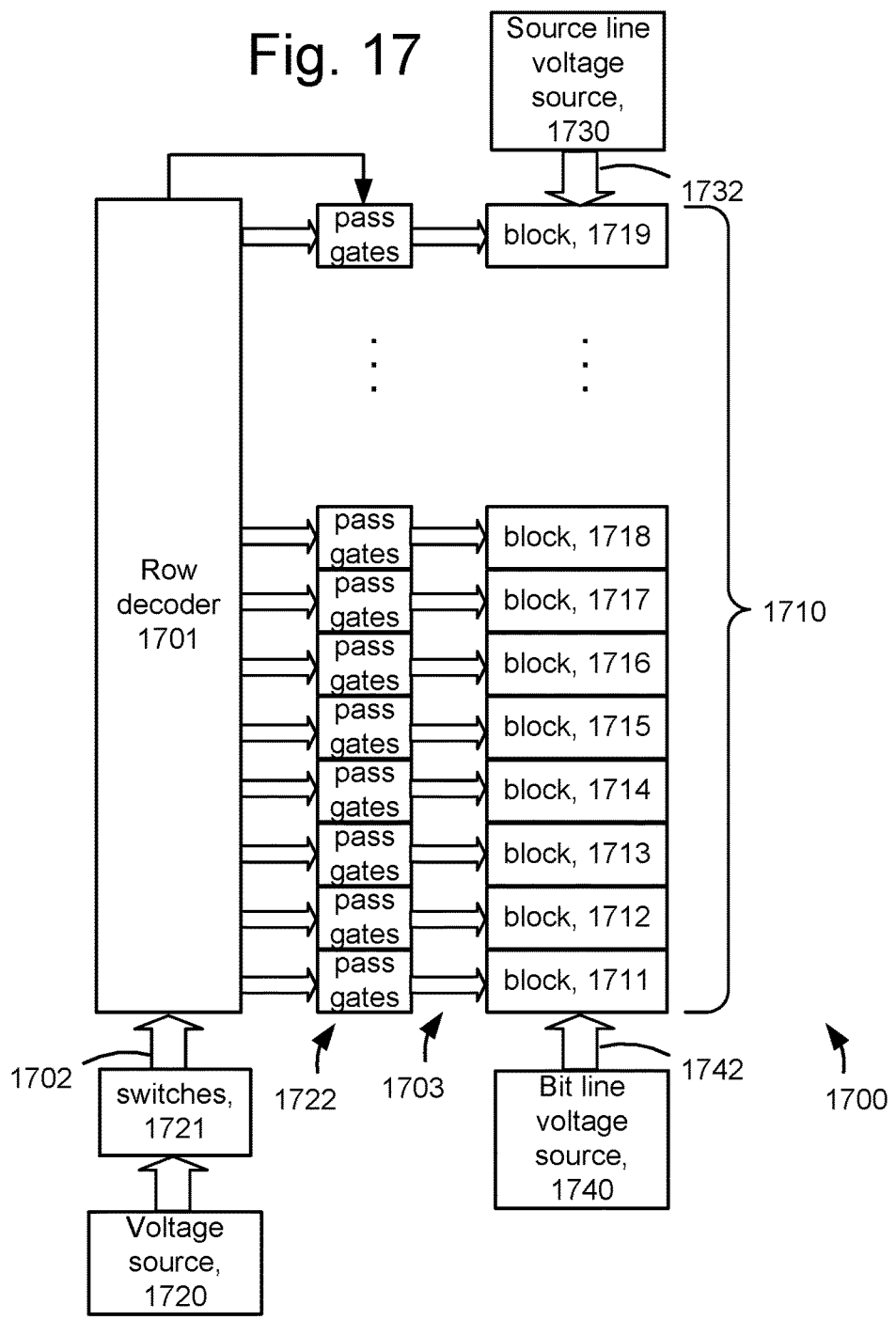

US 9,785,493 B1

DATA RECOVERY METHOD AFTER WORD LINE-TO-WORD LINE SHORT CIRCUIT

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 7C depicts an example memory cell 790.

FIG. 8A depicts an example threshold voltage (Vth) distribution of memory cells, where four data states are used.

FIG. 8B depicts an example Vth distribution of memory cells, where eight data states are used.

FIG. 8C depicts an example Vth distribution of memory cells, where sixteen data states are used.

FIG. 9A depicts an example process for, in a programming operation, recovering data in case of a short circuit between word lines.

FIG. 9B depicts an example process consistent with step 914 of FIG. 9A for, in a programming operation, recovering data from memory cells of a word line having a short circuit.

FIG. 17 depicts an example circuit for providing voltages to blocks of memory cells.

DETAILED DESCRIPTION

Apparatuses and techniques are described for detecting a short circuit between word lines and recovering data from memory cells connected to the word lines.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 12A:
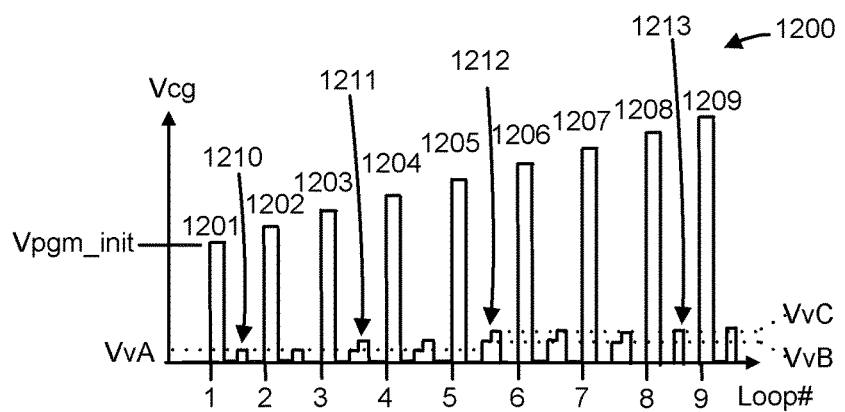
FIG. 12A depicts an example of voltages applied to a selected word line during programming, consistent with step 903 of FIG. 9A.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 12A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 8A). In a three-bit per cell memory device, there are eight data states including the erased state and seven higher data states referred to as the A, B, C, D, E, F and G data states (see FIG. 8B). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8C) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, a short circuit can sometimes occur between adjacent word lines. The short circuit path may be in the dielectric layer which is between the word lines, or between conductive lines which connect voltages to the word lines, for instance. The short circuit prevents the word lines from holding separate voltages, as current will leak between the word lines. In some cases, the short circuit is a nascent or soft short circuit such that the current leakage is relatively small and the word lines can hold separate voltages to some extent.

A short circuit can be caused for various reasons such as variations or defects in the fabrication of the memory device. Moreover, the formation of a short circuit between word lines can be induced by the existence of a relatively large electric field between the word lines. Such a field exists during programming, when a large program voltage such as 20-25 V is applied to a selected word line being programmed and a lower read pass voltage such as 8-10 V is applied to the remaining unselected word lines. When a short circuit is formed, typically the program voltage is pulled down so that the programming operation fails. When this failure occurs, it is desired to recover the data which is already written to the block and move it to a new block.

Moreover, the short circuit can become stronger once it is formed. Suppose a leakage weak spot exists between WLn and WLn+1. WLN represents some nth word line, where n is a word line number. The word lines are numbered according to a word line programming order in a block. WLn+1 is the word line after WLn in the word line programming order. During programming of WLn, the leakage weak spot becomes a strong short and causes a program failure on WLn. After this occurs, the device can read back the data already written on the previously programmed word lines, WL0 to WLn−2. This is true because, when reading out data on WL0 to WLn−2, the read pass bias (Vread pass) of about 8-10 V is applied on both WLn−1 and WLn. This ensures that the cells of WLn−1 and WLn are in a conductive state, so that the short circuit does not affect the sensing of cells connected to WL0 to WLn−2. Moreover, the data which was unsuccessfully programmed to WLn can typically be recovered from the cache/latches.

However, recovering the data from WLn−1 is problematic. WLn−1 is the word line before WLn in the word line programming order. In this scenario, WLn−1 was successfully programmed before programming of WLn was attempted and the short circuit was formed between WLn−1 and WLn. In particular, when reading WLn−1, the cells of WLn need to be provided in a conductive state. Since the cells of WLn were partially programmed, a relatively high Vread, e.g., 8-10 V, is needed on WLn to provide these cells in a conductive state. However, the control gate read voltages on WLn−1 are typically lower than Vread, e.g., they may be between 0-4 V, for instance. The high Vread on WLn will sharply pull up the control gate read voltages on WLn−1, making the read operation inaccurate.

Techniques provided herein address the above and other issues. In one aspect, the cells of WLn are erased before doing a recovery read of WLn−1. The erasing lowers the threshold voltage of the cells on WLn so that a relatively low Vread provides the cells of WLn in a conductive state. The low Vread on WLn allows the cells of WLn−1 to be read with minimal interference to the control gate read voltages. In one embodiment, the erase depth is deeper than the erase depth of a baseline erase operation so that the Vread can be as low as possible to minimize interference to the control gate read voltages.

The existence of a short circuit between WLn and WLn−1 can be detected by initially reading the cells of WLn−1 after programming on WLn fails, and determining that there are one or more uncorrectable errors on the cells of WLn−1. This initial read uses the baseline (high) Vread on WLn so that there is a sharp interference to the control gate read voltages, resulting in read errors. Once the short circuit is detected, an erase operation is performed for WLn. The cells of WLn−1 can be protected from being erased. The cells of WLn−1 can then be read while a low Vread is applied to WLn. Further, the control gate read voltages of WLn−1 can be upshifted from the baseline levels to account for the reduced capacitive coupling from WLn (due to the lower Vread on WLn).

If programming of WLn fails and the initial read of WLn−1 indicates no uncorrectable errors, it can be concluded there is no short circuit between WLn−1 and WLn. Instead, there is a short circuit between WLn and WLn+1. In this case, the data on WLn−1 can be read while the baseline Vread is applied to WLn. As before, the data which was unsuccessfully programmed to WLn can be recovered in the cache/latches.

These and other features are discussed further below.

Figure 1:
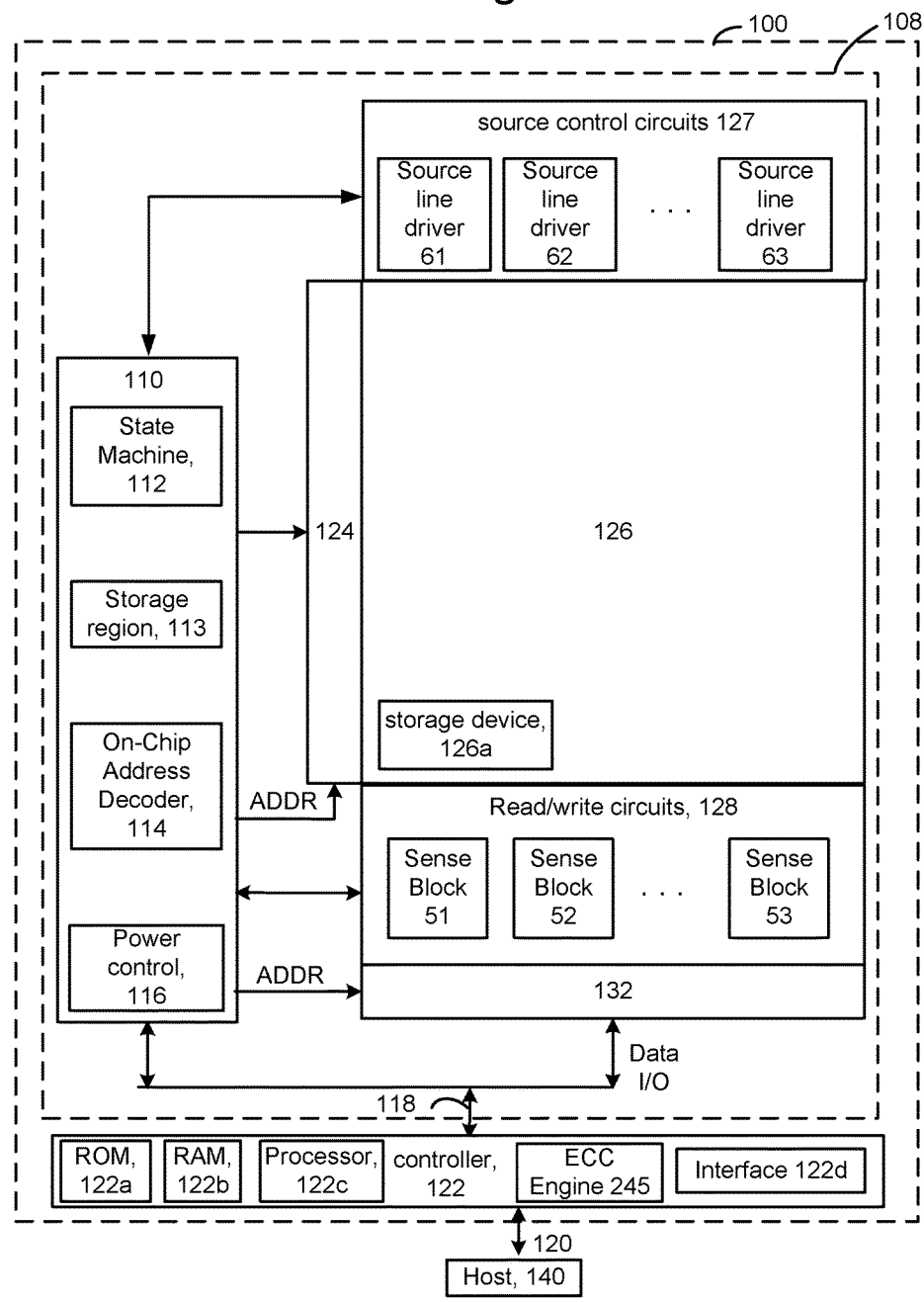
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

In one approach, control circuitry 110 is also in communication with source control circuits 127, which includes source line driver 61, source line driver 62, . . . , source line circuit 63. The source line drivers are used to drive different (or the same) voltages on individual source lines.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
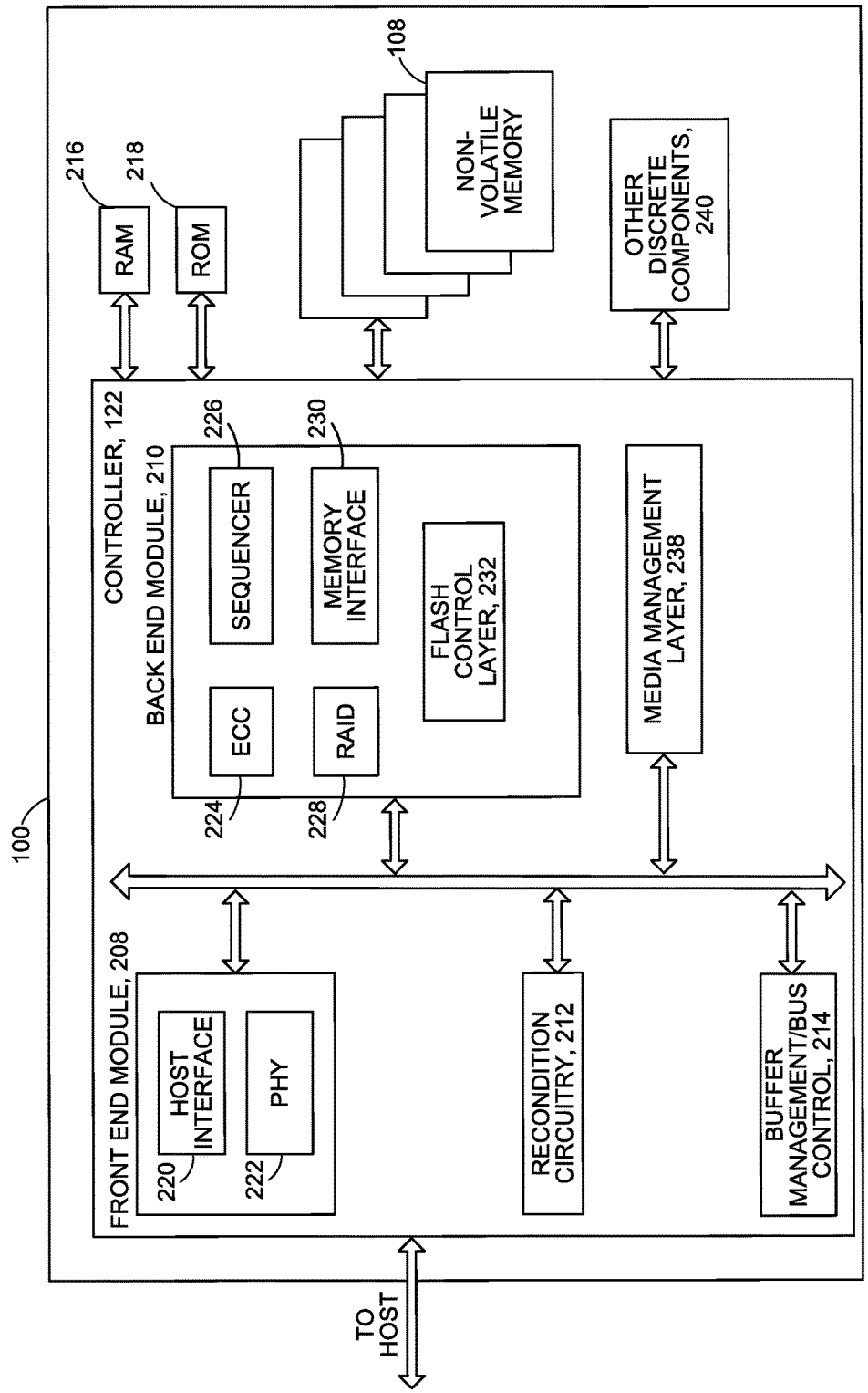
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224.

Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
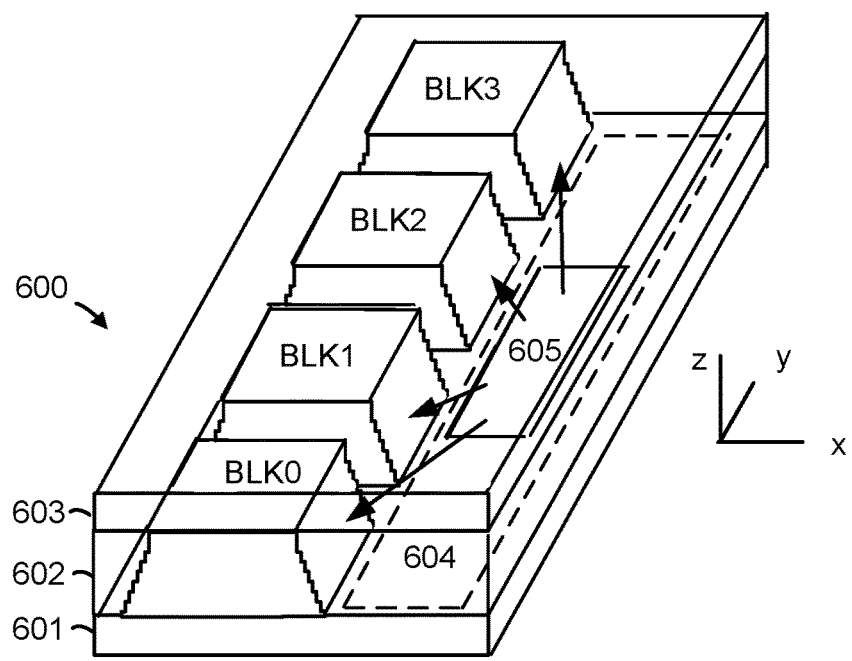
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
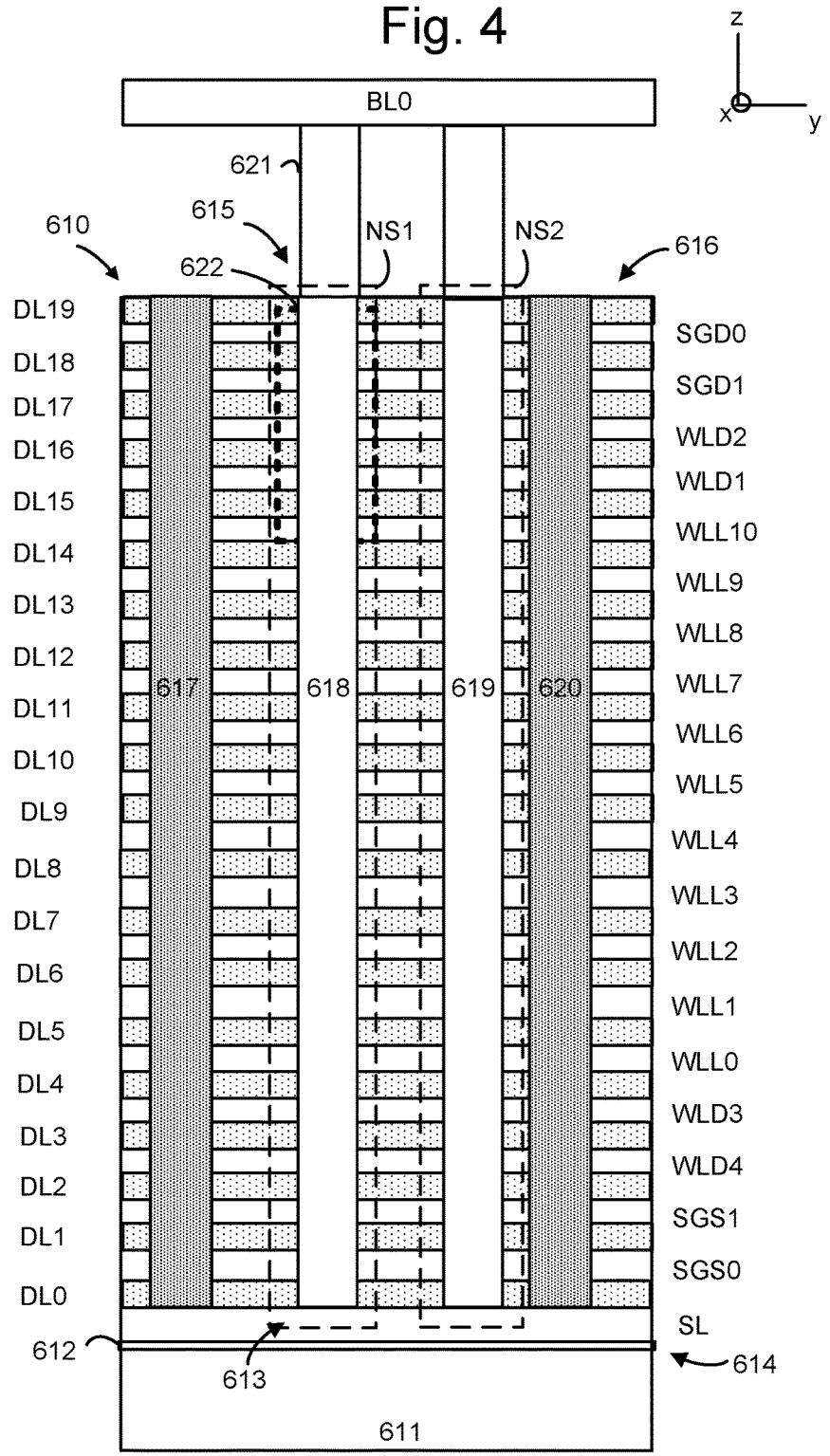
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
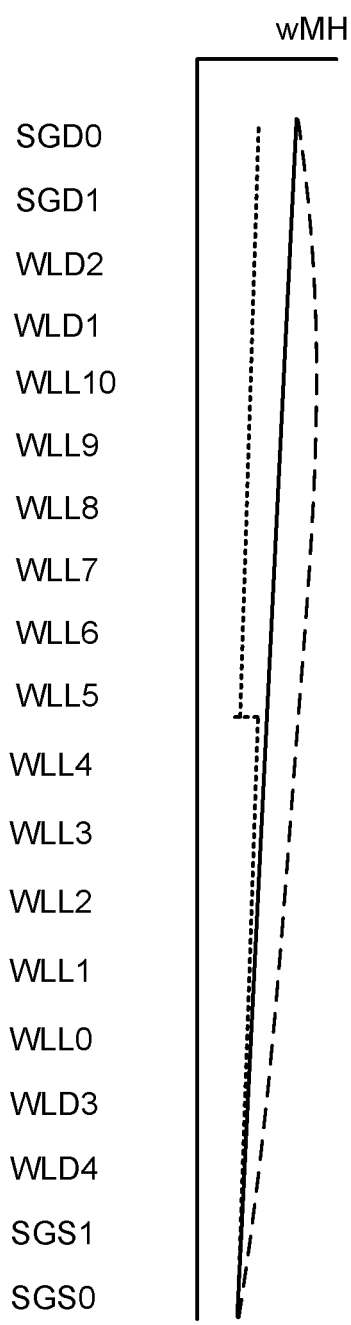
FIG. 5 depicts a plot of memory hole diameter in the stack of FIG. 4.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
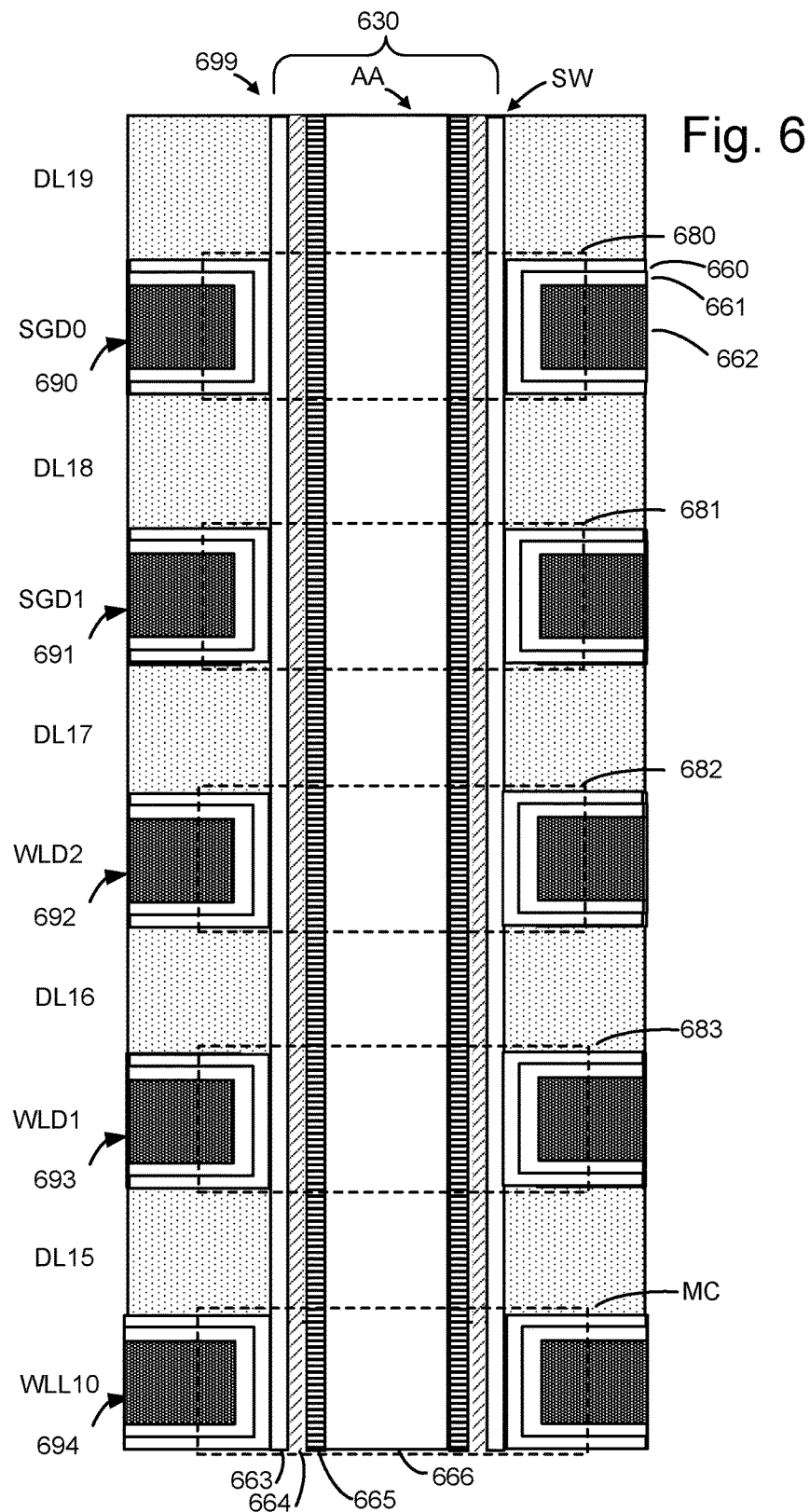
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
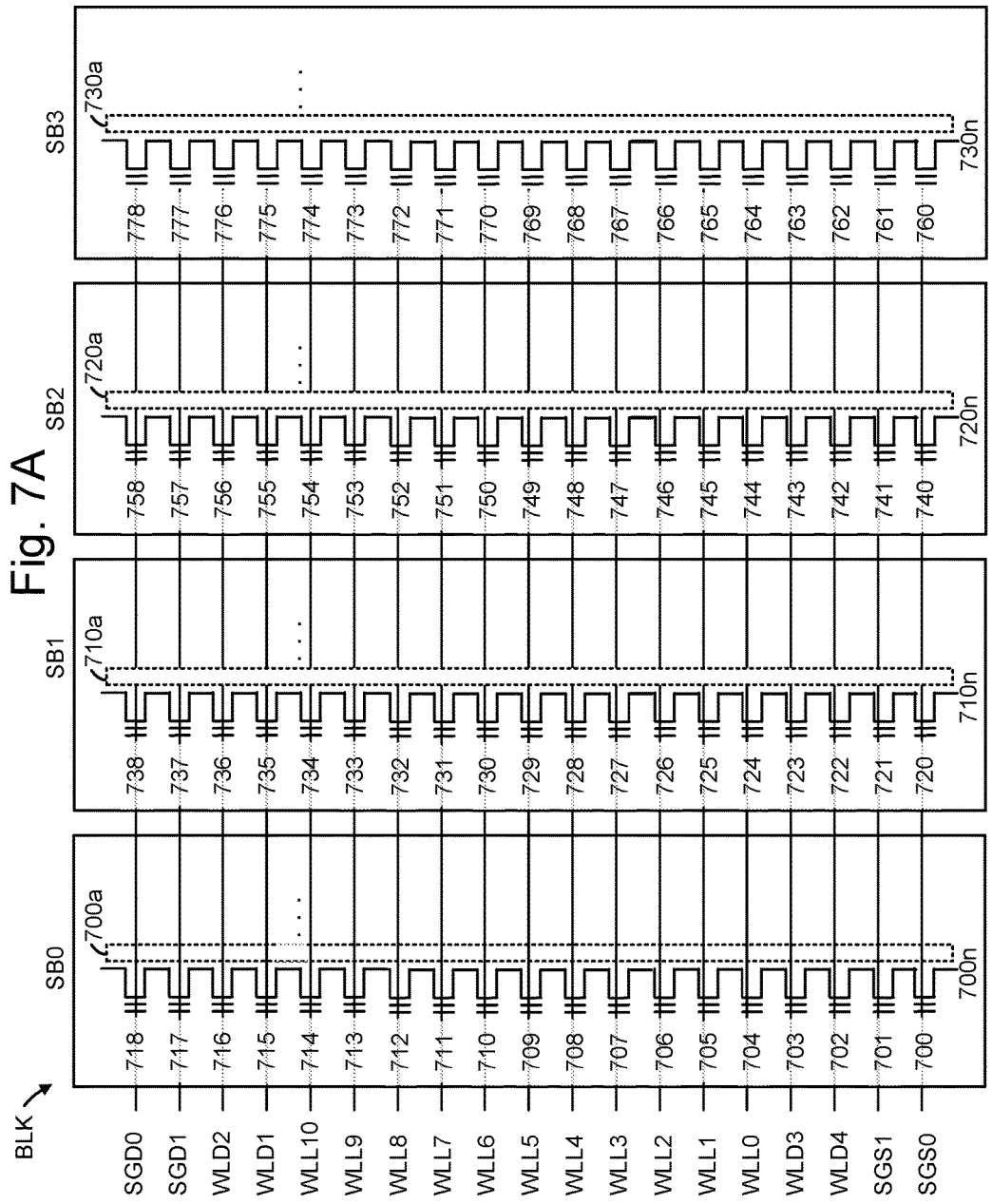
FIG. 7A depicts an example view of NAND strings in sub-blocks in a 3D configuration which is consistent with FIG. 4.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. See FIGS. 9A and 9B. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 7B:
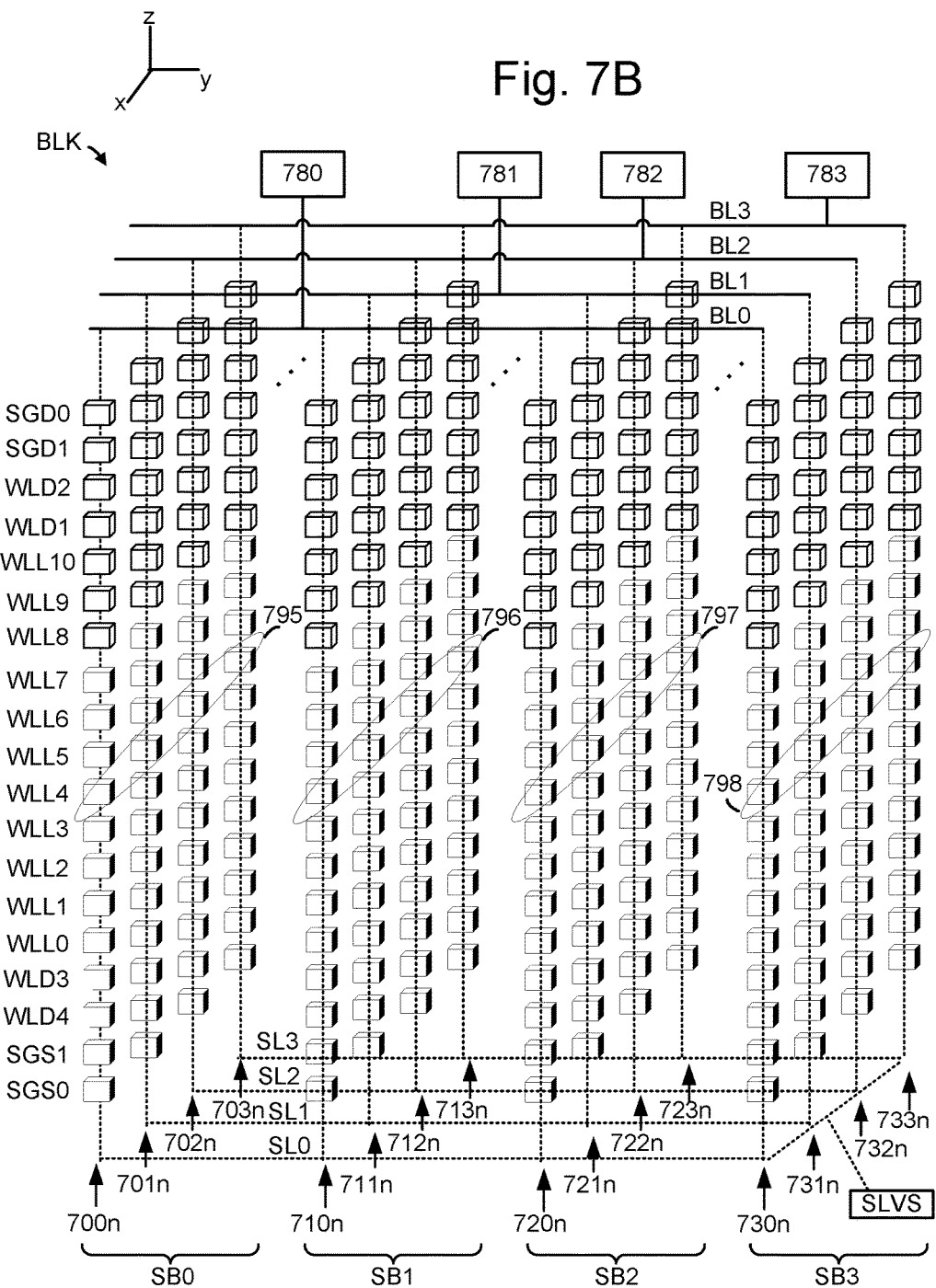
FIG. 7B depicts additional detail of the sub-blocks SB0-SB3 of FIG. 7A.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. In this example, the source lines SL0-SL3 are connected and driven at a common voltage by a voltage source, SLVS.

In another possible implementation, the source lines are separate and can be driven at respective voltages.

FIG. 7C depicts an example memory cell 790. The memory cell comprises a control gate CG which receives a word line voltage Vwl, a drain at a voltage Vd, a source at a voltage Vs and a channel at a voltage Vch. During programming, the cell has a positive control gate-to-channel voltage which draws electrons into the charge trapping layer. During erase, the cell has a positive channel-to-gate voltage which repels electrons from the charge trapping layer.

FIG. 8A depicts an example Vth distribution of memory cells, where four data states are used. The data states are represented by Vth distributions 810, 811, 812 and 813 for the Er (erased), A, B and C states, respectively. The optimum read voltages generally are midway between the Vth distributions of adjacent data states. Accordingly, as the Vth distribution shifts, the optimum read voltages shift. The read voltages for the A, B and C states are VrA, VrB and VrC, respectively. During a programming operation, the verify voltages are VvA, VvB and VvC.

Each read voltage demarcates a lower boundary of a data state of a plurality of data states. For example, VrA demarcates a lower boundary of the A state.

An example encoding of bits for each state is 11, 10, 00 and 01, respectively, in the format of upper page (UP) bit/lower page (LP) bit. A LP read may use VrA and VrC and an UP read may use VrB. A lower or upper bit can represent data of a lower or upper page, respectively. Three programmed data states A, B and C are used in addition to the erased state, Er. With these bit sequences, the data of the lower page can be determined by reading the memory cells using read voltages of VrA and VrC. The lower page (LP) bit=1 if Vth<=VrA or Vth>VrC. LP=0 if VrA<Vth<=VrC. The upper page (UP) bit=1 if Vth<=VrB and LP=0 if Vth>VrB. In this case, the UP is an example of a page which can be determined by reading using one read voltage applied to a selected word line. The UP is an example of a page which can be determined by reading using two read voltages applied to a selected word line. The read voltages are depicted as VrA, VrB and VrC, where each of these can represent the first or second read values, whichever is optimal.

FIG. 8B depicts an example Vth distribution of memory cells, where eight data states are used. The Er, A, B, C, D, E, F and G states have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

FIG. 8C depicts an example Vth distribution of memory cells, where sixteen data states are used. Programming using four bits per cell (16 levels) can involve lower, lower-middle, upper-middle and upper pages. The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS14 and VrS15 for states S1, S2, S3, S4, S5, S6, S7, S8, S9, S10, S11, S12, S13, S14 and S15, respectively.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

Figure 9C:
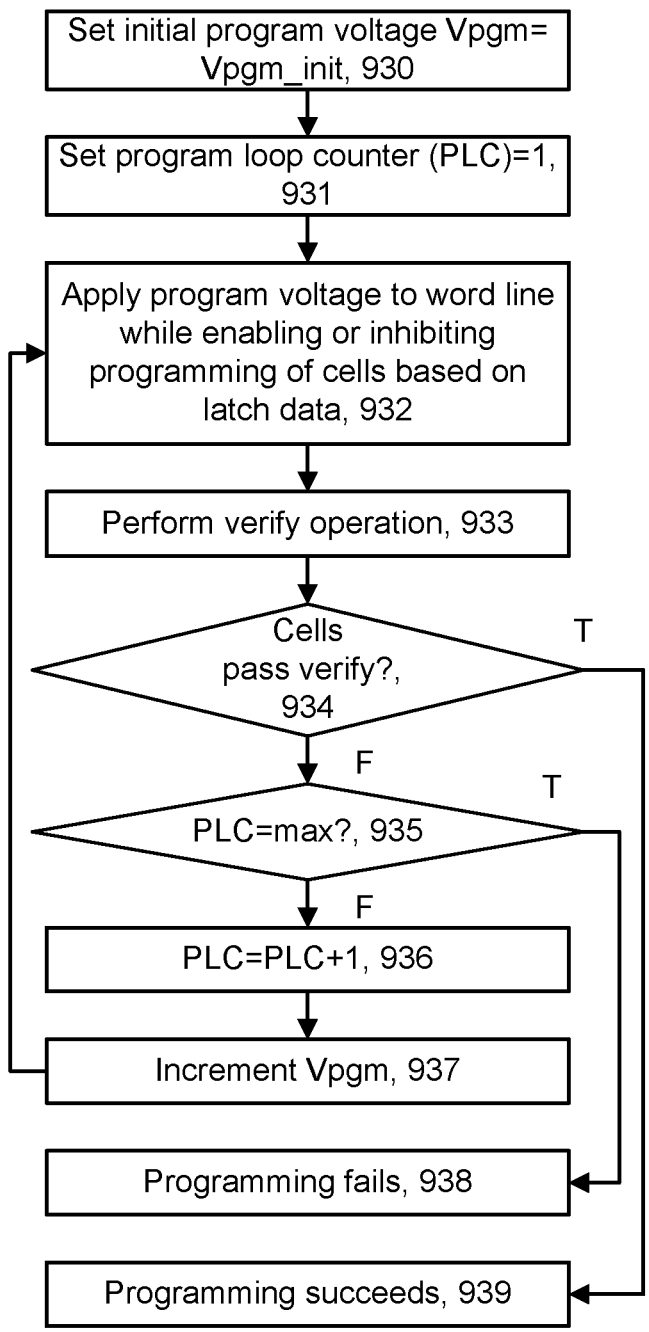
FIG. 9C depicts an example programming operation consistent with step 903 of FIG. 9A.

FIG. 9A depicts an example process for, in a programming operation, recovering data in case of a short circuit between word lines. Step 900 involves erasing a block of memory cells to a first depth. See, e.g., FIG. 11B. Step 901 involves beginning a programming operation for the block. Step 902 initializes a word line index n=0, indicating that the first word line of the block is initially selected for programming (e.g., WL0). Step 903 attempts to program memory cells of the selected word line WLn. For example, this can involve performing a number of program loops or program-verify iterations. See, e.g., FIG. 9C. Each program loop comprises a program pulse which is applied to the selected word line. Typically, the program pulses begin at an initial level and are stepped up in each program loop until a program completion criterion is met or until a maximum allowable number of program loops have been performed. The program completion criterion can be met when all or nearly all (e.g., 95% or more) of the memory cells which are to be programmed to an assigned data state have successfully completed programming. In the case of a word line short circuit, the program completion criterion may not be met.

After step 903, step 905 or 908 is reached. In a first path, at step 905, the programming of WLn is successfully completed, e.g., the program completion criterion is met within the maximum allowable number of program loops. Decision step 906 determines if there is a next word line in the block to program. If decision step 906 is true, step 904 increments the word line index (n=n+1) and step 903 attempts to program memory cells of the next word line. If decision step 906 is false, step 907 is reached, where the programming operation for the block is successfully completed.

In a second path after step 903, at step 908, the programming of WLn has failed, e.g., the program completion criterion is not met within the maximum allowable number of program loops. Step 909 involves reading the cells of WLn−1 and, based on the read results, determining if there are one or more uncorrectable errors in the data read from WLn−1. Error Correction Code (ECC) decoding can determine that a memory cell is supposed to be in a certain data state even when the memory cell is read as being in another data state. For example, a memory cell for which Vth<VrC, indicating a B state memory cell, may be corrected to represent the C state. An ECC code can have redundancies which allow a limited number of errors to be detected and corrected in a unit of data such as a page of data. Examples of ECC techniques include Low-Density Parity Check (LDPC) codes, Turbo codes and concatenated codes. LDPC codes are highly efficient linear block codes made from many single parity check (SPC) codes. Turbo codes use iterative soft-decoding and combine two or more relatively simple convolutional codes and an interleaver to produce a block code. Concatenated codes combine algebraic block codes and convolutional codes. The state machine or controller can evaluate the memory cells based on the read results, perform the ECC decoding and determine whether there are any uncorrectable errors.

At a decision step 910, if there are one or more uncorrectable errors, step 913 involves reading data from the cells of WL0 to WLn−2, one word line at a time, using baseline read parameters, and storing the data in another block. The baseline read parameters can include Vread_base for the unselected word lines and non-upshifted control gate read voltages such as VrA, VrB and VrC for the selected word line. Step 914 involves performing a recovery process for cells of WLn−1 (referred to as a recovery word line WLrec) and storing the data in another block. See FIG. 9B.

If decision step 910 is false, step 911 involves reading data from the cells of WL0 to WLn−1, one word line at a time, using baseline read parameters, and storing the data in another block. After step 911 or 914, step 912 involves reading the WLn data from the latches and storing the data in cells of another block. The current block is then identified as being bad and not used.

FIG. 9B depicts an example process consistent with step 914 of FIG. 9A for, in a programming operation, recovering data from memory cells of a word line having a short circuit. In this situation, the word line which fails programming (WLn or WLrec+1) is shorted to the adjacent, previously programmed word line (WLn−1 or WLrec). Step 920 involves erasing the cells of WLn (WLrec+1) to a second depth. For example, this can be deeper than the baseline, first erase depth of step 900. Step 921 involves reading data from the cells of WLrec by applying upshifted read voltages on WLrec, Vread_low on WLrec+1 and Vread_base on other word lines. These voltages are explained further below. Step 922 involves storing the data in another block.

FIG. 9C depicts an example programming operation consistent with step 903 of FIG. 9A. See also FIG. 12A. Step 930 involves setting an initial program voltage Vpgm=Vpgm_init. Step 931 sets a program loop counter (PLC)=1 to identify a first program loop or program-verify iteration. Step 932 involves applying a program voltage to the word line while enabling or inhibiting programming of cells connected to the word line based on their latch data. Programming can be enabled or inhibited by control of the bit line voltage, for instance. A cell which has completed programming to its assigned data state (the data state identified by data in the latches associated with the cell) or which is assigned to the erased state will be inhibited from further programming. Programming will be enabled for a cell which has not completed programming to its assigned data state. In one approach, programming is inhibited by setting an elevated bit line voltage such as 2-3 V programming is enabled by setting a bit line voltage of 0 V. Step 933 performs a verify operation (e.g., using VvA, VvB or VvC in FIG. 12A) to determine if the cells have reached their assigned data state. At a decision step 934, if all, or nearly all, of the cells have passed their verify test, the programming operation succeeds at step 939.

If decision step 934 is false and PLC has reached a maximum allowed value (max) at decision step 935, the programming fails at step 938. If decision step 934 is false and PLC has not reached the maximum allowed value at decision step 935, PLC is incremented at step 936 and Vpgm is incremented at step 937. The next program voltage is applied at step 932.

Figure 9D:
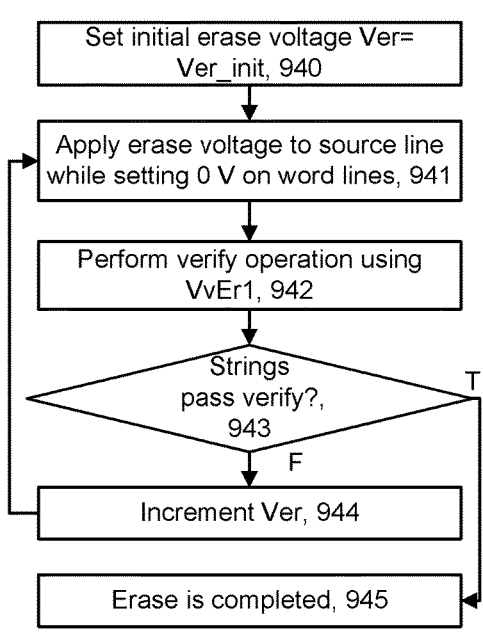
FIG. 9D depicts an example erase operation for word lines in a block consistent with step 900 of FIG. 9A and with FIG. 11B.
Figure 11A:
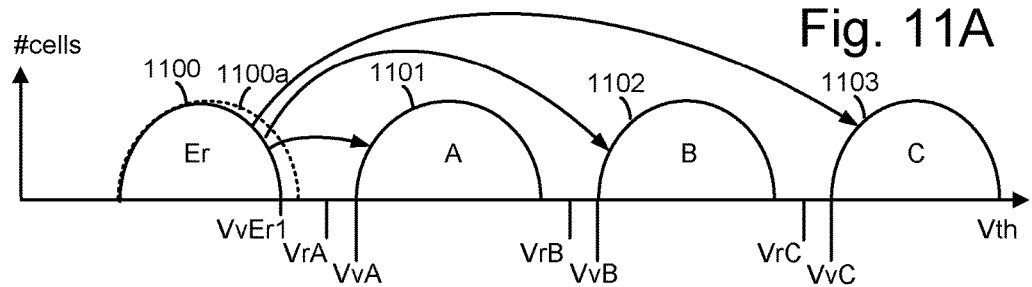
FIG. 11A depicts a threshold voltage (Vth) distribution of a set of memory cells connected to a word line, consistent with FIG. 8A, when Vread_base is applied to the adjacent word line.
Figure 11B:
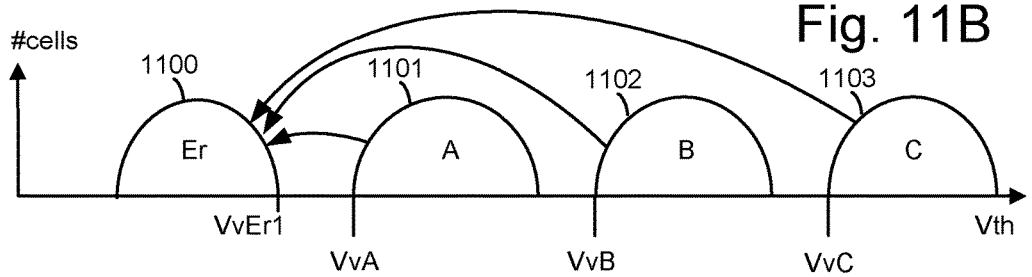
FIG. 11B depicts a threshold voltage (Vth) distribution of a set of memory cells connected to a word line in an erase operation, consistent with step 900 of FIG. 9A and with FIG. 9D.

FIG. 9D depicts an example erase operation for word lines in a block consistent with step 900 of FIG. 9A and with FIG. 11B. This example involves erasing a block to a first erase depth. Step 940 involves setting an initial erase voltage Ver=Ver_init (see FIG. 14A). The erase depth may be set by the erase-verify voltage where a lower erase depth is obtained by a lower erase-verify voltage. Step 941 involves applying an erase voltage to a source line while setting 0 V on each of the word lines. In one approach, the source line is connected to the source end of the memory strings so that the channel is charged up based on the voltage on the source line. The erase voltage may be a relatively high positive voltage such as 20-25 V. With 0 V or other relatively low voltage applied to the word lines, the cells in the block will have a high channel-to-gate voltage which promotes erasing of the cells. Step 942 performs a verify operation (e.g., using VvEr1 in FIG. 14B) to determine if the cells have reached the erased state. The erase-verify test may involve applying VvEr1 to each of the word lines in a block concurrently while sensing a current in each memory string. The sensed current is compared to a reference current. If the Vth of all, or nearly all, cells in the string is below VvEr1, the sensed current will be higher than the reference current and the string has passed the erased verify test. At a decision step 943, if all, or nearly all, of the strings have passed the verify test, the erase operation is completed at step 945. If decision step 943 is false, Ver is incremented at step 944 and the next erase voltage is applied at step 941.

Figure 9E:
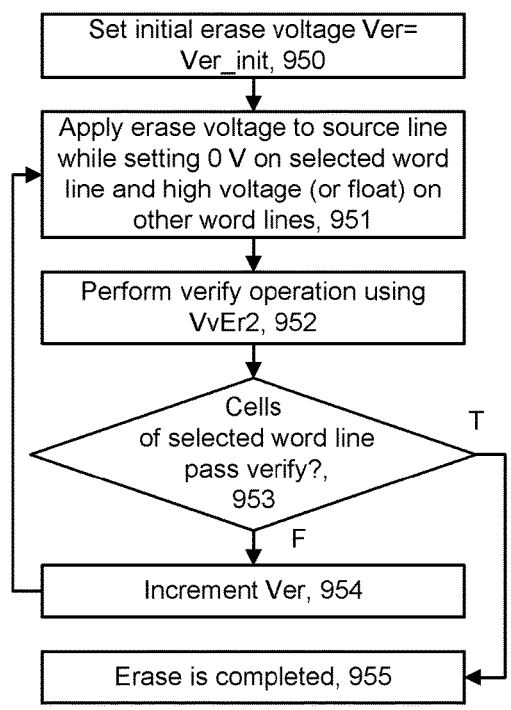
FIG. 9E depicts an example erase operation for a selected word line consistent with step 920 of FIG. 9A and with FIG. 11E.
Figure 11C:
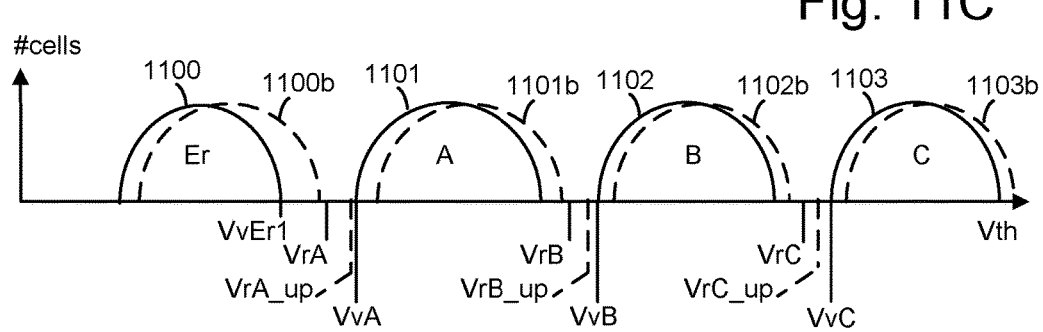
FIG. 11C depicts an upshift in the Vth distribution of the set of memory cells referred to in connection with FIG. 11A, when Vread_low is applied to the adjacent word line instead of Vread_base.
Figure 11D:
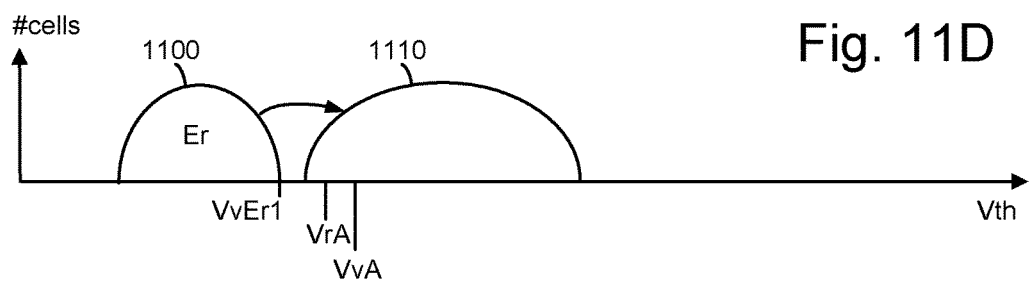
FIG. 11D depicts a Vth distribution of a set of memory cells connected to a word line, where programming of the cells fails due to a short circuit with an adjacent word line, consistent with step 908 of FIG. 9A.
Figure 11E:
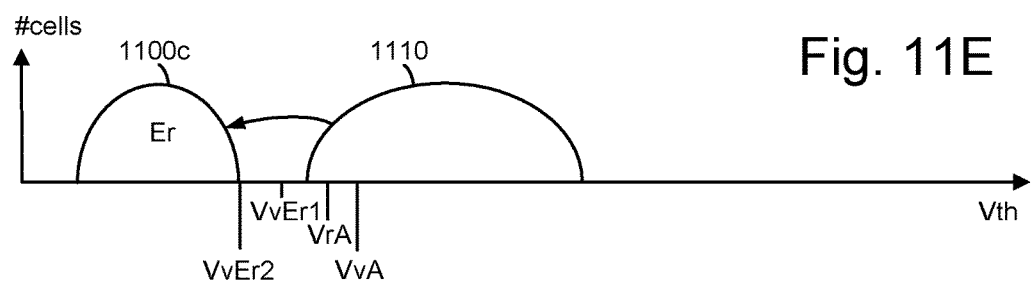
FIG. 11E depicts a Vth distribution of the set of memory cells referred to in connection with FIG. 11D in an erase operation, consistent with step 920 of FIG. 9B and with FIG. 9E.

FIG. 9E depicts an example erase operation for a selected word line consistent with step 920 of FIG. 9B and with FIG. 11E. This example involves erasing cells of one word line to a second erase depth. As an option, this word line erase which occurs when there is a short circuit can be deeper than the baseline erase of the block. This allows a lower Vread_low to be used on WLrec+1, reducing interference with the control gate read voltages on WLrec. In another approach, this word line erase is the same depth as the baseline erase of the block.

Step 950 involves setting an initial erase voltage Ver=Ver_init. Step 951 involves applying an erase voltage to a source line while setting 0 V or other low voltage on the selected word line. A high voltage, comparable to Ver, may be set on the other word lines to not promote erasing of these other word lines. Or, the voltages of these other word lines can be allowed to float. The voltages will float to a level which is comparable to the channel voltage which, in turn, is comparable to Ver. This results in a zero or small channelto-gate voltage which does not promote erasing. Step 952 performs a verify operation (e.g., using VvEr2<VvEr1 in FIG. 14D) to determine if the cells have reached the erased state. The erase-verify test may involve applying VvEr2 to the selected word line while applying a read pass voltage (e.g., 8-10 V) to the remaining word lines in a block, and while sensing a current in each memory string. The read pass voltage provides the associated cells in a strongly conductive state so that the cells of the selected word line can be sensed. The sensed current is compared to a reference current. If the Vth of all, or nearly all, cells of the selected word line is below VvEr2, the sensed current will be higher than the reference current and the selected word line has passed the erased verify test. At a decision step 953, if all, or nearly all, of the cells have passed the verify test, the erase operation is completed at step 955. If decision step 953 is false, Ver is incremented at step 954 and the next erase voltage is applied at step 951. A deeper erase depth refers to erasing to a lower Vth. This can involve using a lower erase verify level such as VvEr2<VvEr1.

Figures 10A, 10B:
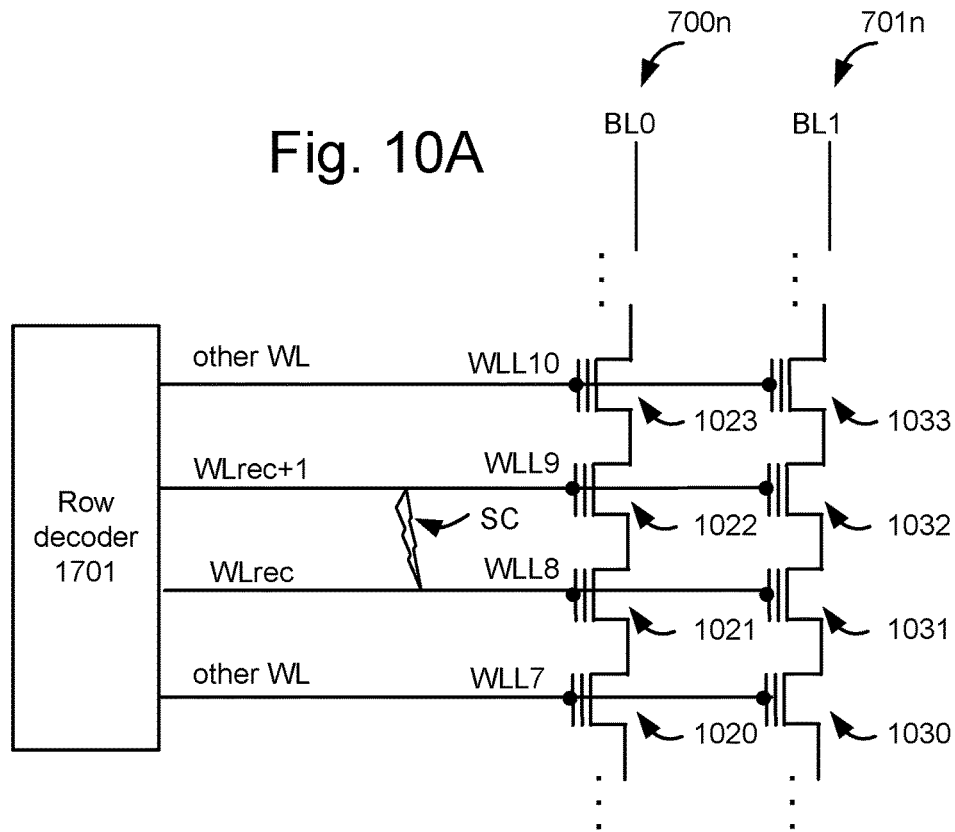
FIG. 10A depicts a circuit diagram comprising example NAND strings 700n and 701n in a block, consistent with FIG. 7B, in which there is a short circuit between word lines.
FIG. 10B depicts example voltages in a baseline read process and a recovery read process.

FIG. 10A depicts a circuit diagram comprising example NAND strings 700n and 701n in a block, consistent with FIG. 7B, in which there is a short circuit (SC) between word lines. Example word line layers include WLL7, WLL8, WLL9 and WLL10 which are connected to memory cells 1020, 1021, 1022 and 1023, respectively, in NAND string 700n and to memory cells 1030, 1031, 1032 and 1033, respectively, in NAND string 701n. SC depicts a short circuit between WLL8 and WLL9. In this example, WLL8 is the recovery word line, WLrec, WLL9 is the adjacent, later-programmed word line, WLrec+1, and WLL7 and WLL10 are examples of other word lines. WLL10 and any higher numbered word lines are not yet programmed. WLL0 to WLL8 are successfully programmed and WLL9 has a program failure.

A row decoder 1701, also depicted in FIG. 17, provides voltages to the word lines during program, erase and read operation.

FIG. 10B depicts example voltages in a baseline read process and a recovery read process. In a baseline read for WLsel, the selected word line being read, WLsel receives control gate read voltages of VrA, VrB or VrC, for example, and WLunsel, the unselected word lines not being read, receive Vread_base. This baseline read is depicted for comparison and might occur if the block was successfully programmed and there was no short circuit. In a recovery read for WLrec, the selected word line being read, WLrec receives upshifted control gate read voltages of VrA_up, VrB_up or VrC_up, for example. WLrec+1, the adjacent word line which experienced the programming failure, receives Vread_low. Other word lines receive Vread_base. See FIGS. 11A, 13A and 13B.

FIG. 11A depicts a threshold voltage (Vth) distribution of a set of memory cells connected to a word line, consistent with FIG. 8A, when Vread_base is applied to the adjacent word line. A Vth distribution 1100 is provided for erased (Er) state memory cells. Three Vth distributions 1101, 1102 and 1103 represent assigned data states A, B and C, respectively, which are reached by memory cells when their Vth exceeds the erase-verify voltage VvA, VvB or VvC, respectively. This example uses four data states. Other numbers of data states can be used as well, such as eight or sixteen. The Vth distribution 1100a represents an increase in the upper tail of the erased state due to program disturb. That is, the programming of the cells to the higher states causes some inadvertent programming of the erased state cells. Baseline read voltages VrA, VrB and VrC are used to read data from a set of cells having this baseline Vth distribution. The baseline Vth distribution results from the typical case where Vread_nom is applied to the adjacent word lines.

The arrows between the Vth distributions represent programming of the cells from the erased state to the programmed states. A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

FIG. 11B depicts a threshold voltage (Vth) distribution of a set of memory cells connected to a word line in an erase operation, consistent with step 900 of FIG. 9A and with FIG. 9D. An erase operation involves one or more erase-verify loops which lower the Vth of the memory cells from programmed states to an erased state. The erase operation may cause the programmed memory cells to transition from the Vth distributions 1101, 1102 and 1103 to the Vth distribution 1100. During the erase operation, a verify test determines whether the Vth of the cells is less than VvEr1.

FIG. 11C depicts an upshift in the Vth distribution of the set of memory cells referred to in connection with FIG. 11A, when Vread_low is applied to the adjacent word line instead of Vread_base. The upshifted Vth distributions 1100b, 1101b, 1102b and 1103b represent the Er, A, B and C data states, respectively. When the cells of WLrec are being read in the recovery process, Vread_low<Vread_base is applied to WLrec+1. As a result, there is a reduction in capacitive coupling from WLrec+1 to WLrec. To compensate for this, the control gate read voltages on WLrec are upshifted relative to the baseline voltages. The upshifted control gate read voltages help ensure that the data is read back correctly from WLrec. The upshifted control gate read voltages are VrA_up, VrB_up or VrC_up for the A, B and C data states, respectively. These read voltages are positioned optimally between the upshifted Vth distributions.

Vread_base may be applied to WL0 to WLrec−1 when they are the unselected word lines.

FIG. 11D depicts a Vth distribution of a set of memory cells connected to a word line, where programming of the cells fails due to a short circuit with an adjacent word line, consistent with step 908 of FIG. 9A. As in FIG. 11A, the cells are programmed starting from the erased state Vth distribution 1100. However, the cells do not complete programming so that some unknown Vth distribution 1110 is obtained for the cells connected to WLrec+1.

FIG. 11E depicts a Vth distribution of the set of memory cells referred to in connection with FIG. 11D in an erase operation, consistent with step 920 of FIG. 9B and with FIG. 9E. The erase operation results in a transition from the Vth distribution 1110 to the Vth distribution 1100c, for example. An erase-verify voltage of VvEr2 is used so that a deeper erase is achieved than in FIG. 11B, as an option.

FIG. 12A depicts an example of voltages applied to a selected word line during programming, consistent with step 903 of FIG. 9A. The vertical axis depicts Vcg, control gate or word line voltage, and the horizontal axis depicts time or program loop number. A one pass programming operation with four data states is depicted. Other options are possible. The programming operation comprises a waveform 1200. The waveform 1200 includes a series of program voltages 1201 to 1209 that are applied to a word line selected for programming and to an associated set of memory cells. This example performs verify tests based on the program loop. For example, the A, B and C state cells are verified in loops 1-4, 3-7 and 5-9, respectively. An example, verify waveform 1210 comprises an A state verify voltage at VvA. An example verify waveform 1211 comprises A and B state verify voltages at VvA and VvB, respectively. An example verify waveform 1212 comprises B and C state verify voltages at VvB and VvC, respectively. An example verify waveform 1213 comprises a C state verify voltage at VvC. The program voltages (pulses) 1201 to 1209 are also depicted. An initial program pulse has the magnitude of Vpgm_init. A maximum allowable number of program loops can be enforced, e.g., 15-20 program loops.

Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages. Incremental Step Pulse Programming (ISPP) is used in this example, in which the program voltage steps up in each successive program loop using a fixed or varying step size.

Figure 12B:
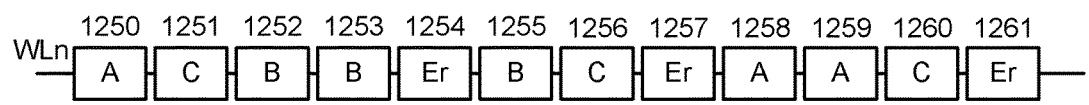
FIG. 12B depicts an example set of memory cells which is programmed by the voltages of FIG. 12A.

FIG. 12B depicts an example set of memory cells which is programmed by the voltages of FIG. 12A. The cells 1250, 1251, 1252, 1253, 1254, 1255, 1256, 1257, 1258, 1259, 1260 and 1261 have assigned data states of A, C, B, B, Er, B, C, Er, A, A, C and Er, respectively. The A state cells 1250, 1258 and 1259, B state cells 1252, 1253 and 1255 are verified in loops 1-4, 3-7 and 5-9, respectively.

Figure 13A:
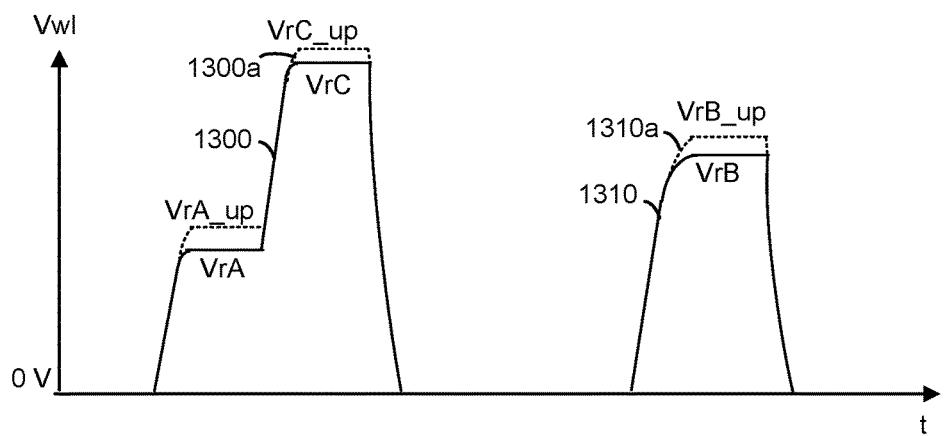
FIG. 13A depicts a plot of example read voltages applied to a selected word line, including baseline read voltages VrA, VrB and VrC consistent with steps 909 and 911 of FIG. 9A, and upshifted read voltages VrA_up, VrB_up and VrC_up consistent with step 921 of FIG. 9B.
Figure 13B:
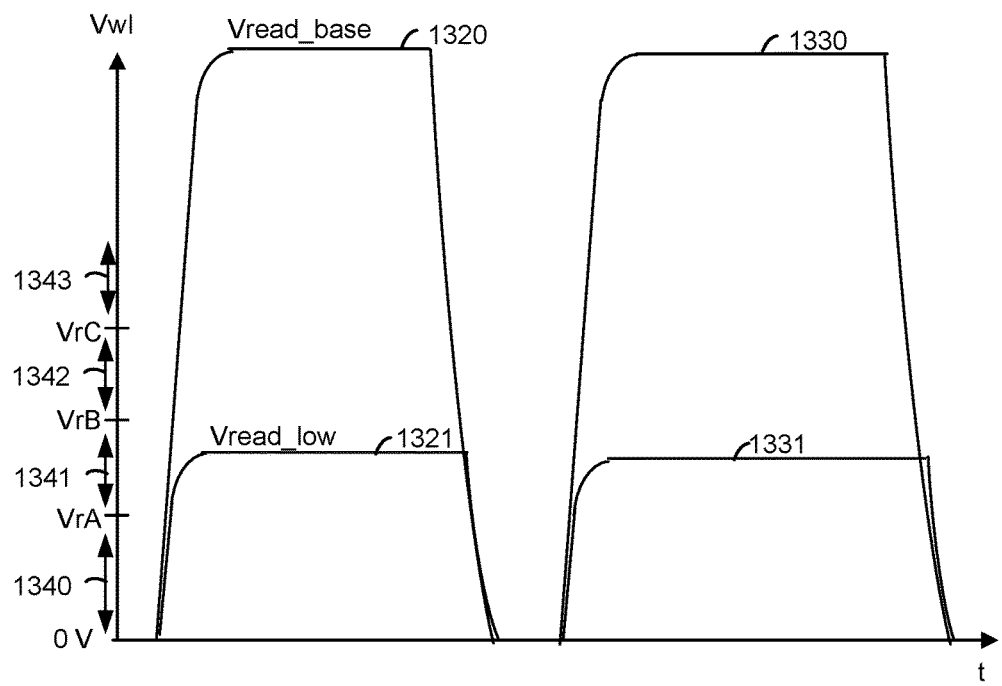
FIG. 13B depicts a plot of example read pass voltages applied to an unselected word line, including a baseline read pass voltage Vread_base consistent with steps 909 and 911 of FIG. 9A, and a low read pass voltage, Vread_low, consistent with step 921 of FIG. 9B.

FIG. 13A depicts a plot of example read voltages applied to a selected word line, including baseline read voltages VrA, VrB and VrC consistent with steps 909 and 911 of FIG. 9A, and upshifted read voltages VrA_up, VrB_up and VrC_up consistent with step 921 of FIG. 9B. In FIGS. 13A and 13B, the vertical axis represents a word line voltage (Vwl) and the horizontal axis represents time. In this example, a lower page of data is read followed by an upper page. A baseline, non-recovery read is described first (see solid line). For the lower page, the A and C states are read using a read voltage waveform 1300 having baseline read voltages of VrA and VrC, respectively. For the upper page, the B state is read using a read voltage waveform 1310 having a baseline read voltage of VrB. For a recovery read, upshifted read voltages are used (see dotted line). For example, for the lower page, the A and C states are read using a read voltage waveform 1300a having upshifted read voltages of VrA_up and VrC_up, respectively. For the upper page, the B state is read using a read voltage waveform 1310a having an upshifted read voltage of VrB_up.

FIG. 13B depicts a plot of example read pass voltages applied to an unselected word line, including a baseline read pass voltage Vread_base consistent with steps 909 and 911 of FIG. 9A, and a low read pass voltage, Vread_low, consistent with step 921 of FIG. 9B. FIG. 13B is time-aligned with the plot of FIG. 13A and roughly to scale in amplitude. The vertical axis also depicts Vth ranges 1340, 1341, 1342 and 1343 for the Er, A, B and C states, respectively, for comparison to the word line voltage. For a baseline read operation of a selected word line, Vread_base (plot 1320) is applied to the unselected word lines while VrA and VrC are applied to the selected word line. Subsequently, Vread_base (plot 1330) is applied to the unselected word lines while VrB is applied to the selected word line.

For a recovery read operation of a selected word line (WLrec), Vread_low (plot 1321) is applied to WLrec+1, and Vread_base (plot 1320) is applied to the remaining unselected word lines while VrA_up and VrC_up are applied to the selected word line. Subsequently, Vread_low (plot 1331) is applied to WLrec+1, and Vread_base (plot 1330) is applied to the remaining unselected word lines while VrB_up is applied to the selected word line.

Consider that the Vth range 1340 represents the erased state cells of WLrec+1. With Vread_low applied to WLrec+1, these cells will be in a conductive state assuming Vread_low exceeds the Vth range 1340 by a sufficient margin. As a result, the cells of WLrec+1 will not be in a non-conductive state which prevents sensing of other cells in the strings. For the remaining word lines, other than WLrec and WLrec+1 (the word lines short circuited together), Vread_base exceeds the Vth range 1343 by a sufficient margin to provide the associated cells in a conductive state. As a result, the cells of the remaining word lines acts as pass transistors to allow sensing of a selected cell in the string. Sensing of a selected cell in a string requires the other cells in the string to be in a conductive state, so that the conductive or non-conductive state of the string is solely a function of the conductive or non-conductive state of the selected cell.

In one approach, the read pass voltage of Vread_low is less than a threshold voltage of a highest data state of the plurality of data states (e.g., Vread_low<VrC). In another approach, Vread_low is less than a threshold voltage of a midrange data state of the plurality of data states (e.g., Vread_low<VrA or VrB). A midrange data state (e.g., A or B) is between the erased state and the highest state (e.g., C).

Figure 14A:
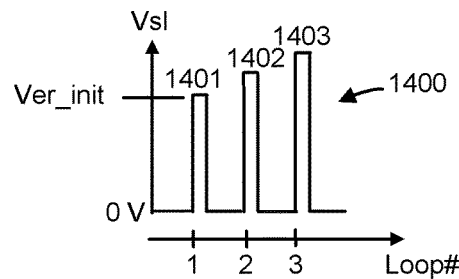
FIG. 14A depicts a plot of example erase voltages applied to a source line in an erase to a first depth, consistent with FIGS. 9D and 11B.
Figure 14B:
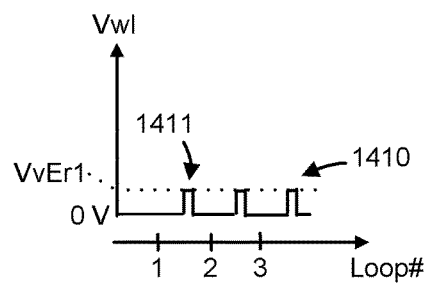
FIG. 14B depicts a plot of verify voltages applied to word lines in a block, consistent with the example of FIG. 14A.
Figure 14C:
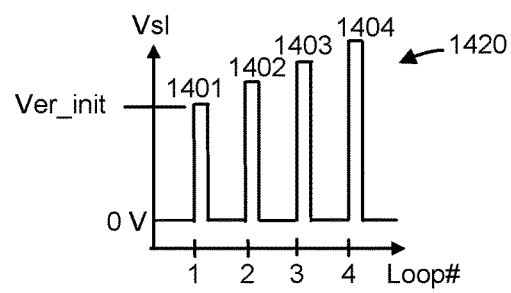
FIG. 14C depicts a plot of example erase voltages applied to a source line in an erase to a second depth, consistent with FIGS. 9E and 11E.
Figure 14D:
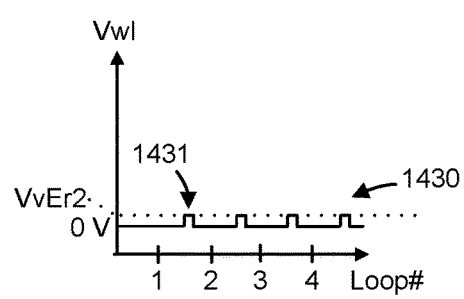
FIG. 14D depicts a plot of verify voltages applied to a selected word line, consistent with the example of FIG. 14C.
Figure 14E:
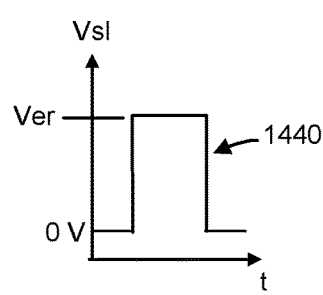
FIG. 14E depicts a plot of an example erase voltage applied to a source line in an erase to a second depth, consistent with FIG. 11E and as an alternative to FIG. 14C.

In FIGS. 14A, 14C and 14E, the vertical axis depicts the source line voltage (Vsl) and the horizontal axis depicts a number of erase loops or time. FIG. 14A to 14E are time aligned.

FIG. 14A depicts a plot of example erase voltages applied to a source line in an erase to a first depth, consistent with FIGS. 9D and 11B. The erase voltages 1401, 1402 and 1403 in the waveform 1400 begin at Ver_init and increase incrementally until the erase operation is completed.

FIG. 14B depicts a plot of verify voltages applied to word lines in a block, consistent with the example of FIG. 14A. The waveform 1410 includes verify voltages 1411 at a magnitude of VvEr1. This can be a 0 V or a relatively small negative or positive voltage, for instance. VvEr1>0 V in this example.

FIG. 14C depicts a plot of example erase voltages applied to a source line in an erase to a second depth, consistent with FIGS. 9E and 11E. In a waveform 1420, this example adds a fourth erase voltage 1404 to the erase voltages 1401, 1402 and 1403 of FIG. 14A. Since the verify voltage VvEr2 (FIG. 14D) is lower than VvEr1, one or more additional erase-verify iterations may be needed to complete the erase operation. This assumes that, other than the verify voltage, FIG. 14C uses the same erase parameters, e.g., Ver_init, step size and erase pulse duration, as FIG. 14A. It is also possible to change these parameters when performing the erase of WLrec+1, compared to performing the full block erase. Generally, the erase of the cells of WLrec+1 can be less accurate than a block erase so that the erase parameters for WLrec+1 can provide a faster erase. For example, Ver_init, step size and/or erase pulse duration can be larger for the erase of WLrec+1 compared to the block erase.

It is also possible to use the same verify voltage, or even a higher verify voltage, for the single word line erase compared to the full block erase, so that the erase depth of the single word line erase is equal or higher, respectively, than the full block erase.

FIG. 14D depicts a plot of verify voltages applied to a selected word line, consistent with the example of FIG. 14C. The waveform 1430 includes verify voltages 1431 at a magnitude of VvEr2<VvEr1. This can be 0 V or a relatively small negative or positive voltage, for instance. VvEr2>0 V in this example.

FIG. 14E depicts a plot of an example erase voltage 1440 applied to a source line in an erase to a second depth, consistent with FIG. 11E and as an alternative to FIG. 14C. In this example, there is no verify test. Instead, a single erase pulse with a relatively long duration (longer than in FIGS. 14A and 14C) is used. This provides a less accurate erase of the cells of WLrec+1 but this is acceptable. The Vth width of the cells of WLrec+1 can be relatively wide and the Vth level can be less precise than in the baseline case because the erase is for the purpose of a read recovery, after which the block is no longer used. In comparison, in a baseline erase operation, the Vth of the erased state needs to be accurately positioned so that there will be an adequate, but too large, separation between the Vth of the erased state cells and the Vth of the cells of the lowest programmed state (e.g., A state) after a programming operation.

Figure 15:
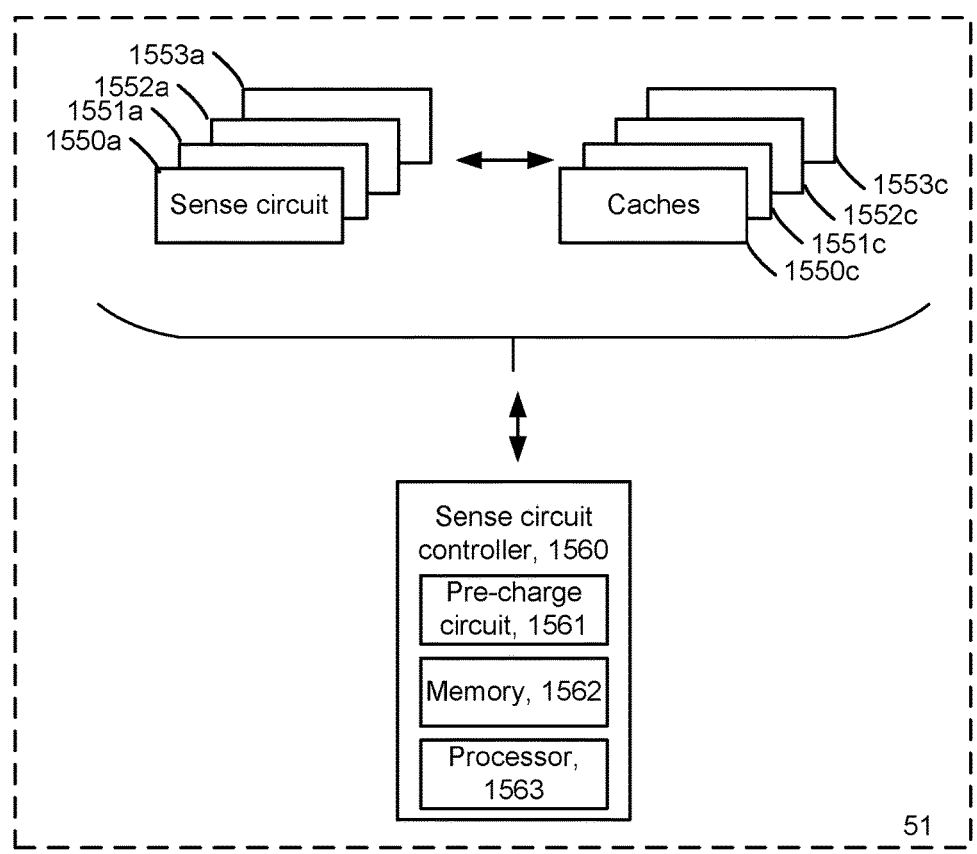
FIG. 15 depicts an example block diagram of a sense block 51 in the column control circuitry of FIG. 1.

FIG. 15 depicts an example block diagram of a sense block 51 in the column control circuitry of FIG. 1. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 1550a, 1551a, 1552a and 1553a are associated with caches 1550c, 1551c, 1552c and 1553c, respectively.

In one approach, different subsets of bit lines can be sensed using different respective sense blocks. This allows the processing load which is associated with the sense circuits to be divided up and handled by a respective processor in each sense block. For example, a sense circuit controller 1560 can communicate with the set, e.g., sixteen, of sense circuits and latches. The sense circuit controller may include a pre-charge circuit 1561 which provides a voltage to each sense circuit for setting a pre-charge voltage. The sense circuit controller may also include a memory 1562 and a processor 1563.

Further example details of the sense circuit controller and the sense circuits are provided below.

Figure 16:
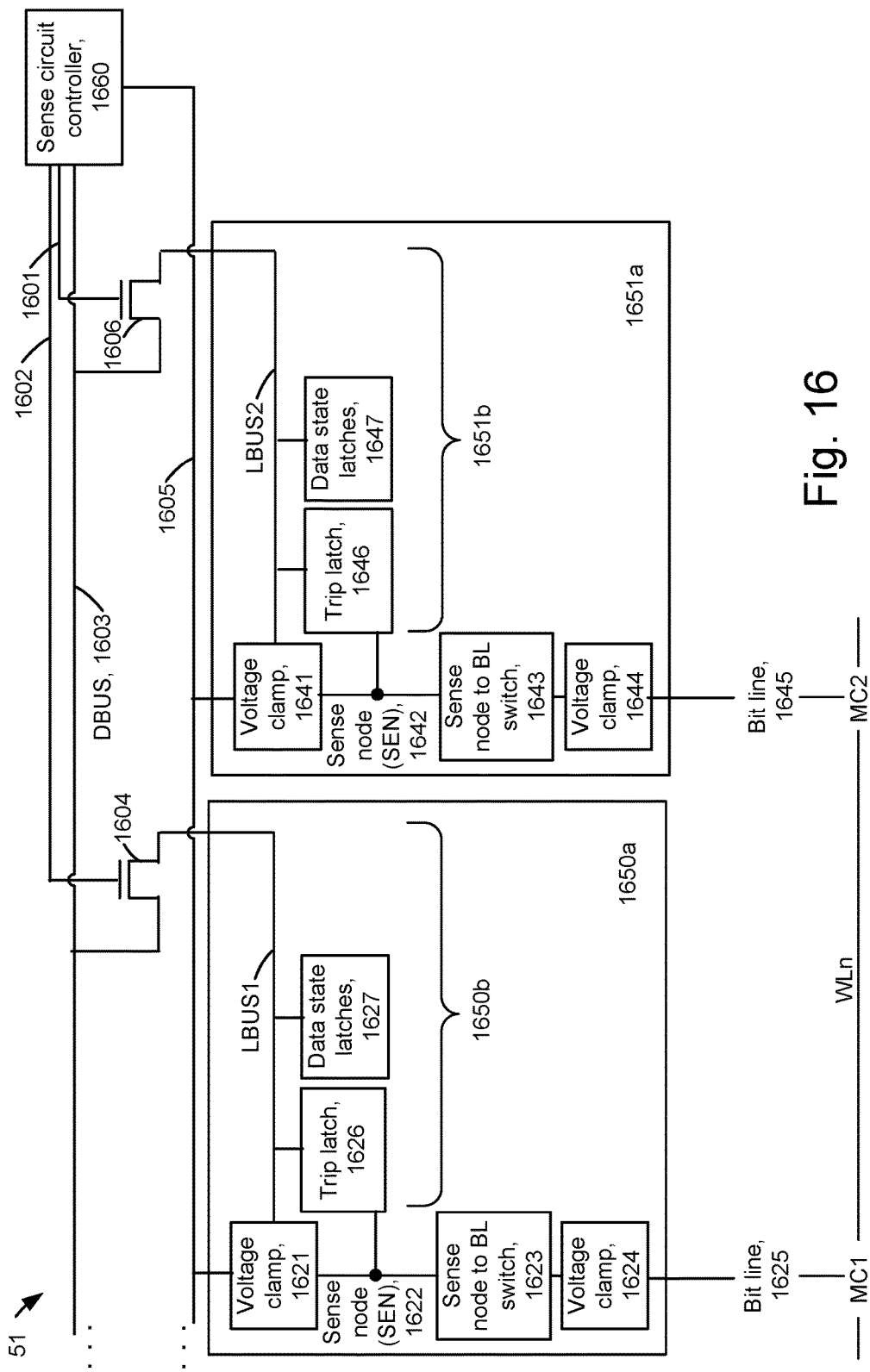
FIG. 16 depicts another example block diagram of a sense block 51 in the column control circuitry of FIG. 1.

FIG. 16 depicts another example block diagram of a sense block 51 in the column control circuitry of FIG. 1. The sense circuit controller 1660 communicates with multiple sense circuits including example sense circuits 1650a and 1651a. The sense circuit 1650a includes latches 1650b, including a trip latch 1626 and data state latches 1627. During a program operation, the data state latches may store the data which identifies the assigned data state of cells MC1 and MC2, which are connected to the bit lines 1625 and 1645, respectively. In case of a failure in programming data to cells of a word line, this data can be read and stored in another block, as discussed.

The sense circuit further includes a voltage clamp 1621 such as a transistor which sets a pre-charge voltage at a sense node 1622 (SEN). A sense node-to-bit line (BL) switch 1623 selectively allows the sense node to communicate with a bit line 1625, e.g., the sense node is electrically connected to the bit line so that the sense node voltage can decay. The bit line 1625 is connected to one or more memory cells, such as a memory cell MC1. A voltage clamp 1624 can set a voltage on the bit line, such as during a sensing operation or during a program voltage. A local bus, LBUS1, allows the sense circuit controller to communicate with components in the sense circuit, such as the latches 1650b and the voltage clamp in some cases. To communicate with the sense circuit 1650a, the sense circuit controller provides a voltage via a line 1602 to a transistor 1604 to connect LBUS1 with a data bus DBUS, 1603. The communicating can include sending data to the sense circuit and/or receive data from the sense circuit.

The sense circuit controller can communicate with different sense circuits in a time-multiplexed manner, for instance. A line 1605 may be connected to the voltage clamp in each sense circuit, in one approach.

The sense circuit 1651a includes latches 1651b, including a trip latch 1646 and data state latches 1647. A voltage clamp 1641 may be used to set a pre-charge voltage at a sense node 1642 (SEN). A sense node-to-bit line (BL) switch 1643 selectively allows the sense node to communicate with a bit line 1645, and a voltage clamp 1644 can set a voltage on the bit line. The bit line 1645 is connected to one or more memory cells such as a memory cell MC2. A local bus, LBUS2, allows the sense circuit controller to communicate with components in the sense circuit, such as the latches 1651b and the voltage clamp in some cases. To communicate with the sense circuit 1651a, the sense circuit controller provides a voltage via a line 1601 to a transistor 1606 to connect LBUS2 with DBUS. The lines 1601 and 1602 can be considered to be sense amplifier control lines.

The example memory cells MC1 and MC2 are connected to a selected word line WLn.

A cache may be associated with each sense circuit and connected to DBUS.

During a read operation, the data latches may store data which results from sensing of the respective memory cells.

FIG. 17 depicts an example circuit 1700 for providing voltages to blocks of memory cells. In this example, a row decoder 1701 provides voltages to word lines and select gates of each block in set of blocks 1710. The set could be in a plane and includes blocks 1711 to 1719. The row decoder provides a control signal to pass gates 1722 which connect the blocks to the row decoder. Typically, operations, e.g., program or read, are performed on one selected block at a time. The row decoder can connect global word lines 1702 to local word lines 1703. Voltages are provided on the global word lines from a voltage source 1720. The voltage source may provide a few different voltages to switches 1721 which connect to the global word lines. For example, during a programing operation, a program voltage may be provided on a selected global word line which is connected to a selected local word line of a selected block which is to be programmed. A pass voltage may be provided on remaining, unselected global word lines which are connected to unselected local word lines of the selected block.

During a read/verify operation, a read/verify voltage may be provided on a selected global word line which is connected to a selected local word line of a selected block which is to be read or verified. A read pass voltage may be provided on remaining global word lines which are connected to unselected local word lines of the selected block.

During an erase operation for a block, 0 V may be provided on the global word lines which are connected to the local word lines of a selected block which is to be erased. During an erase operation for a selected word line, 0 V may be provided on a global word line which is connected to the selected local word line in a selected block. A high voltage comparable to Ver may be provided on remaining global word lines which are connected to the remaining local word lines in a selected block. Or, the remaining local word lines can be disconnected from the global word lines by making the pass gates non-conductive to float the voltages of the remaining local word lines.

The various components, including the row decoder, may receive commands from a controller such as the state machine 112 or the controller 122 to perform the functions described herein.

A set of source lines 1732 is shared by the blocks. A voltage source 1730 provides voltages to the source lines. A set of bit lines 1742 is also shared by the blocks. A voltage source 1740 provides voltages to the bit lines.

In one implementation, an apparatus comprises: a block of memory cells, the memory cells are connected to word lines and are arranged in strings; and a control circuit. The control circuit is configured to: make a detection of a failure in an attempt to program data into memory cells of a particular word line (WLrec+1) in the block; in response to the detection of the failure, make a determination that memory cells in an adjacent word line (WLrec) comprise one or more uncorrectable errors; and in response to the determination, erase memory cells of the particular word line (WLrec+1), and read data from the memory cells in the adjacent word line (WLrec) while the memory cells of the particular word line (WLrec+1) are erased.

In another implementation, a method comprises: programming memory cells connected to one word line (WLrec); subsequently, making an attempt to program memory cells connected to another word line (WLrec+1), adjacent to the one word line (WLrec); determining that the attempt fails; in response to the determining that the attempt fails, determining that there is a short circuit between the one word line (WLrec) and the another word line (WLrec+1); and in response to the determining that there is the short circuit, erasing the memory cells connected to another word line (WLrec+1) followed by reading the memory cells connected to one word line (WLrec).

In another implementation, an apparatus comprises: means for programming memory cells connected to one word line (WLrec); means for beginning to program memory cells connected to another word line (WLrec+1), adjacent to the one word line (WLrec); means for determining that the memory cells connected to the another word line (WLrec+1) do not meet a programming criterion; means for reducing threshold voltages of the memory cells connected to the another word line (WLrec+1); and means for reading the memory cells connected to one word line (WLrec).

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 17 including the decoders, voltage drivers, switches and pass transistors. The means can further include any of the control circuits in FIGS. 1 and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a block of memory cells, the memory cells are connected to word lines and are arranged in strings; and
a control circuit, the control circuit is configured to:
make a detection of a failure in an attempt to program data into memory cells of a particular word line in the block;
in response to the detection of the failure, make a determination that memory cells in an adjacent word line comprise one or more uncorrectable errors; and
in response to the determination, erase memory cells of the particular word line, and read data from the memory cells in the adjacent word line while the memory cells of the particular word line are erased.

2. The apparatus of claim 1, wherein:
the control circuit is configured to not promote erase of the memory cells in the adjacent word line during the erase of the memory cells of the particular word line.

3. The apparatus of claim 2, wherein:
the control circuit, to not promote the erase of the memory cells in the adjacent word line during the erase of the memory cells of the particular word line, is configured to float a voltage of the adjacent word line during the erase of the memory cells of the particular word line.

4. The apparatus of claim 2, wherein:
the control circuit, to not promote the erase of the memory cells in the adjacent word line during the erase of the memory cells of the particular word line, is configured to provide a positive control gate-to-channel voltage of the memory cells of the adjacent word line.

5. The apparatus of claim 4, wherein:
the control circuit, to perform the erase of the memory cells of the particular word line, is configured to charge up channels of the strings while applying a voltage to the particular word line which results in a positive channel-to-gate voltage of the memory cells of the particular word line.

6. The apparatus of claim 1, wherein:
prior to the erase of the memory cells of the particular word line, the control circuit is configured to erase the block of memory cells to a first depth, followed by programming of the memory cells of the adjacent word line, followed by programming of the memory cells of the particular word line; and
the control circuit is configured to erase the memory cells of the particular word line to a second depth which is deeper than the first depth.

7. The apparatus of claim 6, wherein:
the control circuit is configured to use a first erase-verify voltage during the erase of the block of memory cells and a second erase-verify voltage, lower than the first erase-verify voltage, during the erase of the memory cells of the particular word line.

8. The apparatus of claim 1, wherein:
the memory cells of the adjacent word line store data in a plurality of data states;

the control circuit, to read data from the memory cells in the adjacent word line, is configured to apply an upshifted control gate read voltage to the adjacent word line for each data state of the plurality of data states, and sense whether each memory cell of the adjacent word line is in a conductive state during each upshifted control gate read voltage; and for each data state of the plurality of data states, the upshifted control gate read voltage is higher than a corresponding baseline control gate read voltage.

9. The apparatus of claim 1, wherein:

the memory cells of the adjacent word line store data in a plurality of data states; and the control circuit, to read data from the memory cells in the adjacent word line, is configured to:

apply a control gate read voltage to the adjacent word line for each data state of the plurality of data states;

during each control gate read voltage, sense whether each memory cell of the adjacent word line is in a conductive state; and apply to the particular word line, a read pass voltage which is less than a threshold voltage of a highest data state of the plurality of data states.

10. The apparatus of claim 9, wherein:

the read pass voltage is less than a threshold voltage of a midrange data state of the plurality of data states.

11. The apparatus of claim 9, wherein:

during each control gate read voltage, the memory cells of the particular word line are provided in a conductive state by the read pass voltage.

12. The apparatus of claim 1, wherein:

the control circuit, to make the detection of the failure, is configured to determine that the attempt to program data into the memory cells of the particular word line does not meet a completion criterion within a maximum allowable number of program loops.

13. The apparatus of claim 1, wherein:

each word line comprises a conductive layer;

the conductive layers alternate with dielectric layers in a stack; and the attempt to program the data results in a short circuit between conductive layers corresponding to the particular word line and the adjacent word line.

14. A method, comprising:

programming memory cells connected to one word line;

subsequently, making an attempt to program memory cells connected to another word line, adjacent to the one word line;

determining that the attempt fails;

in response to the determining that the attempt fails, determining that there is a short circuit between the one word line and the another word line; and in response to the determining that there is the short circuit, erasing the memory cells connected to another word line followed by reading the memory cells connected to one word line.

15. The method of claim 14, further comprising:

the determining that the attempt fails comprises determining that the memory cells connected to the another word line do not meet a completion criterion within a maximum allowable number of program loops.

16. The method of claim 14, further comprising:

not promoting erasing of the memory cells connected to the one word line during the erase of the memory cells connected to the another word line.

17. The method of claim 14, wherein:

the programming of the memory cells connected to one word line comprises performing a plurality of program loops, wherein each program loop is performed by applying a program voltage followed by one or more verify voltages to the one word line, and during each of the one or more verify voltages, applying a first read pass voltage to the another word line; and the method further comprising, during the reading of the memory cells connected to the one word line, applying a second read pass voltage, lower than the first read pass voltage, to the another word line.

18. The method of claim 14, wherein:

the determining that there is a short circuit between the one word line and the another word line comprises reading data from the memory cells of the one word line and, based on the reading, determining that there are one or more uncorrectable errors in the data.

19. An apparatus, comprising:

means for programming memory cells connected to one word line;

means for beginning to program memory cells connected to another word line, adjacent to the one word line;

means for determining that the memory cells connected to the another word line do not meet a programming completion criterion;

means for erasing the memory cells connected to the another word line; and means for reading the memory cells connected to one word line.

20. The apparatus of claim 19, wherein:

means for countering a reduction of threshold voltages of the memory cells connected to the another word line during the reducing of the threshold voltages of the memory cells connected to the another word line.

* * * * *